United States Patent [19]
Takase et al.

[11] Patent Number: 5,410,512
[45] Date of Patent: Apr. 25, 1995

[54] SEMICONDUCTOR MEMORY DEVICE

[75] Inventors: Satoru Takase, Yokohama; Tohru Furuyama, Tokyo; Donald C. Stark, Zushi; Natsuki Kushiyama; Kiyofumi Sakurai, both of Yokohama; Hiroyuki Noji, Kawasaki, all of Japan; Shigeo Ohshima, Menlo Park, Calif.

[73] Assignee: Kabushiki Kaisha Toshiba, Kawasaki, Japan

[21] Appl. No.: 64,438

[22] Filed: May 21, 1993

[30] Foreign Application Priority Data

May 22, 1992 [JP] Japan .................................. 4-131095

[51] Int. Cl.$^6$ .............................................. G11C 7/00
[52] U.S. Cl. ............................ 365/230.03; 365/230.06
[58] Field of Search ...................... 365/230.03, 230.06, 365/230.08, 189.09, 203, 231

[56] References Cited

U.S. PATENT DOCUMENTS

| | | | |
|---|---|---|---|
| 4,701,885 | 10/1987 | McElroy | 365/230.03 |
| 5,121,354 | 6/1992 | Mandalia | . |
| 5,241,510 | 8/1993 | Kobayashi | 365/230.03 |
| 5,251,180 | 10/1993 | Ohshima | 365/230.06 |
| 5,257,235 | 10/1993 | Miyamoto | . |

OTHER PUBLICATIONS

N. Kushiyama et al, "500 Mbyte/sec Data-Rate 512 Kbits×9 DRAM Using a Novel I/O Interface," 1992 Symposium on VLSI Circuits Digest of Technical Papers 7-4, pp. 66-67, dated Jun. 4, 1992.

Primary Examiner—Joseph A. Popek
Assistant Examiner—A. Zarabian
Attorney, Agent, or Firm—Banner, Birch, McKie & Beckett

[57] ABSTRACT

A semiconductor memory device includes a silicon chip and sub-arrays formed in the chip. In each of the sub-arrays, memory cells arranged in a matrix form, word lines provided for respective rows of each of the sub-arrays, and bit lines provided for respective columns of each of the sub-arrays are arranged. Further, in the chip, amplifier groups for amplifying data read out from the memory cells are arranged for the respective sub-arrays. Amplifiers connected to respective bit lines are provided in the amplifier groups and the amplifiers each have a function of continuously holding data read out from the memory cell.

10 Claims, 26 Drawing Sheets

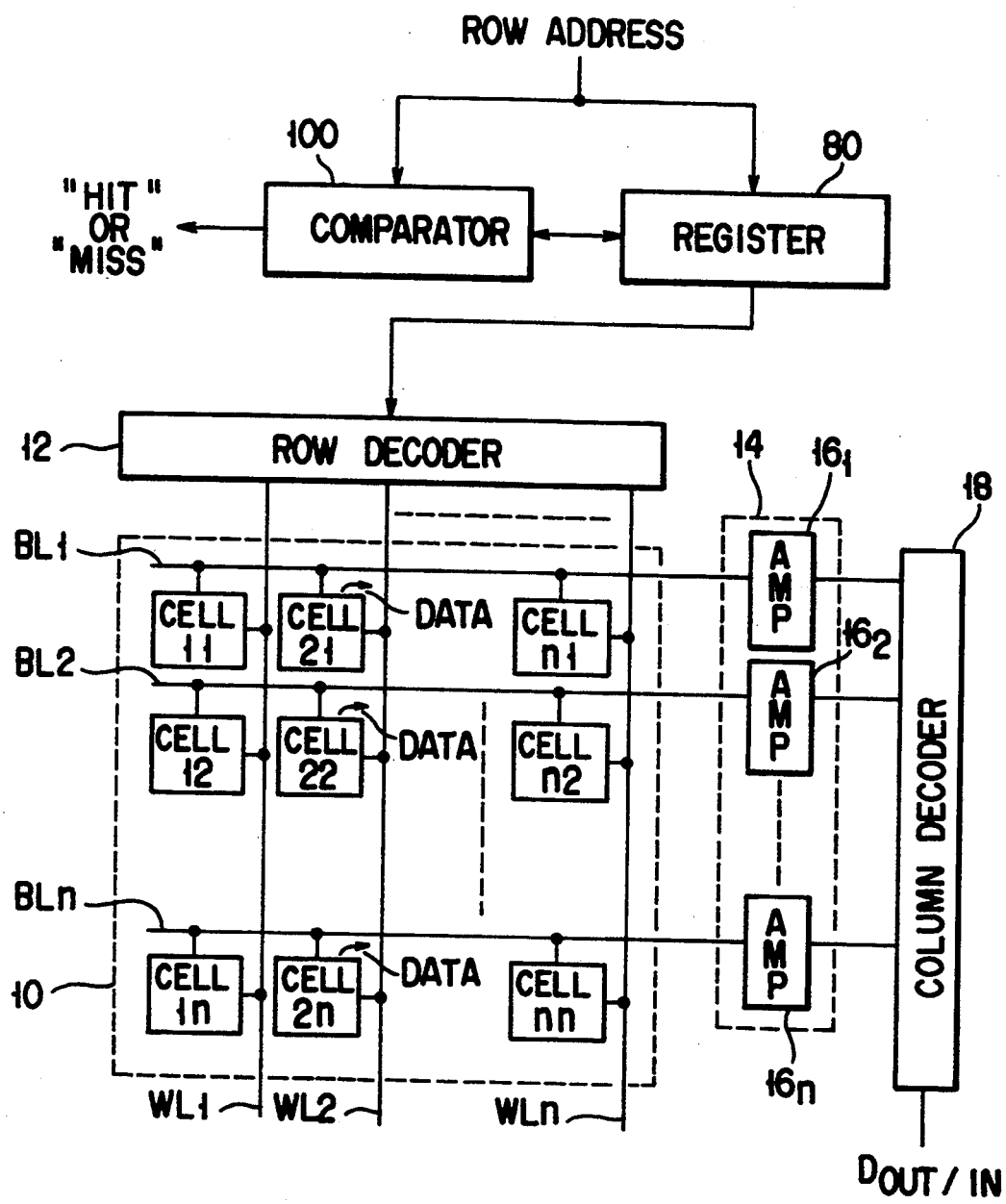
F I G. 1

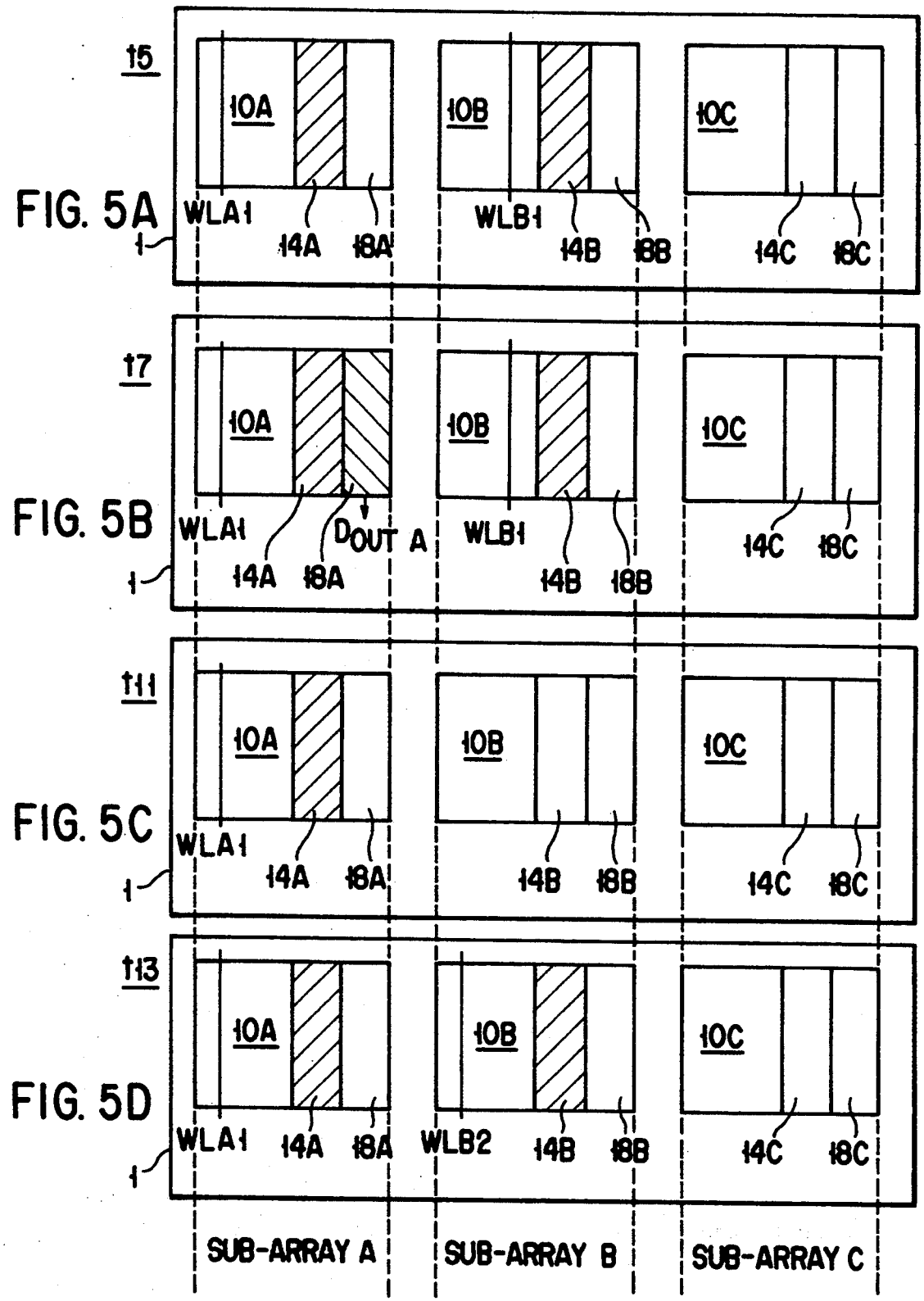

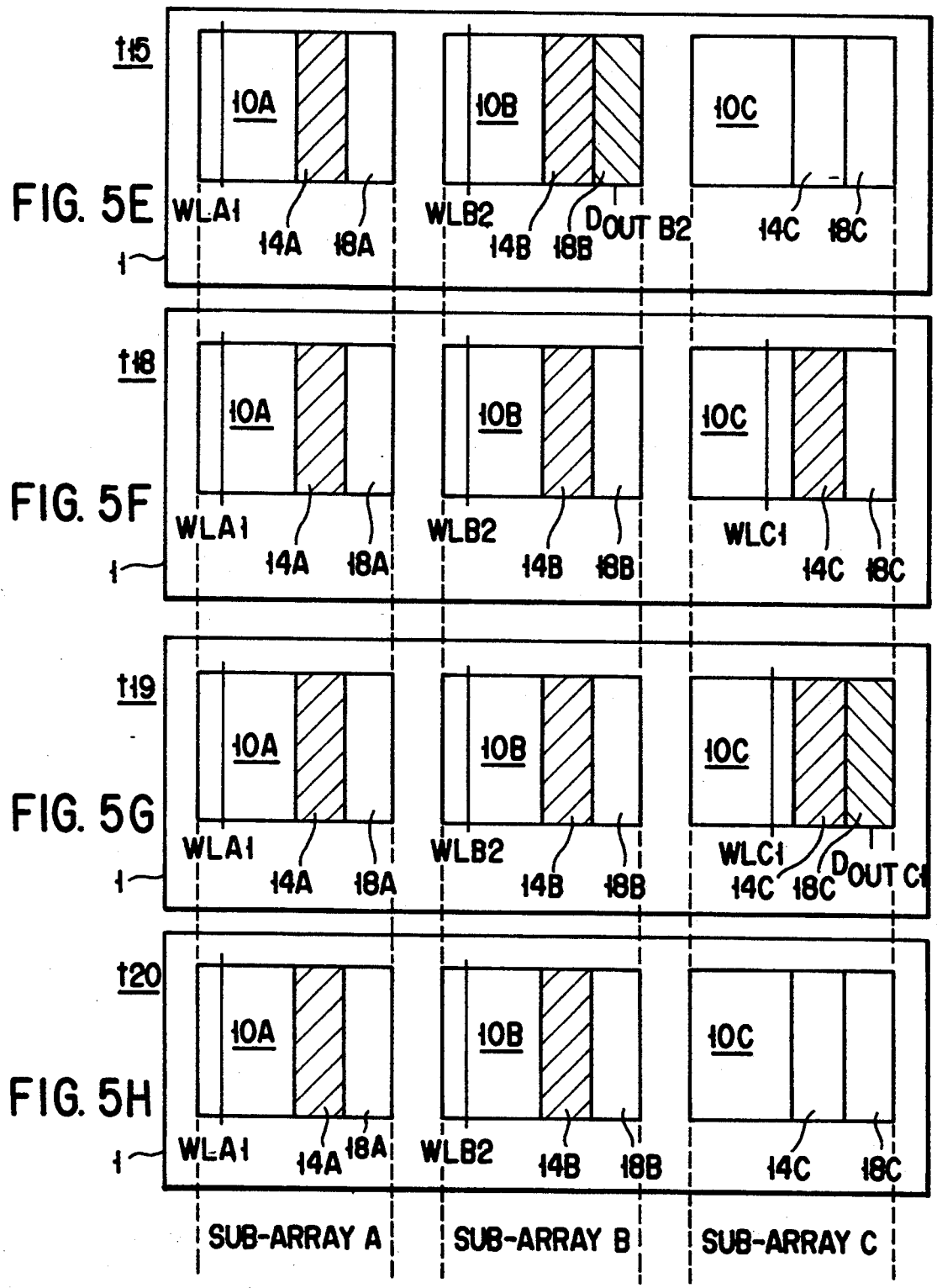

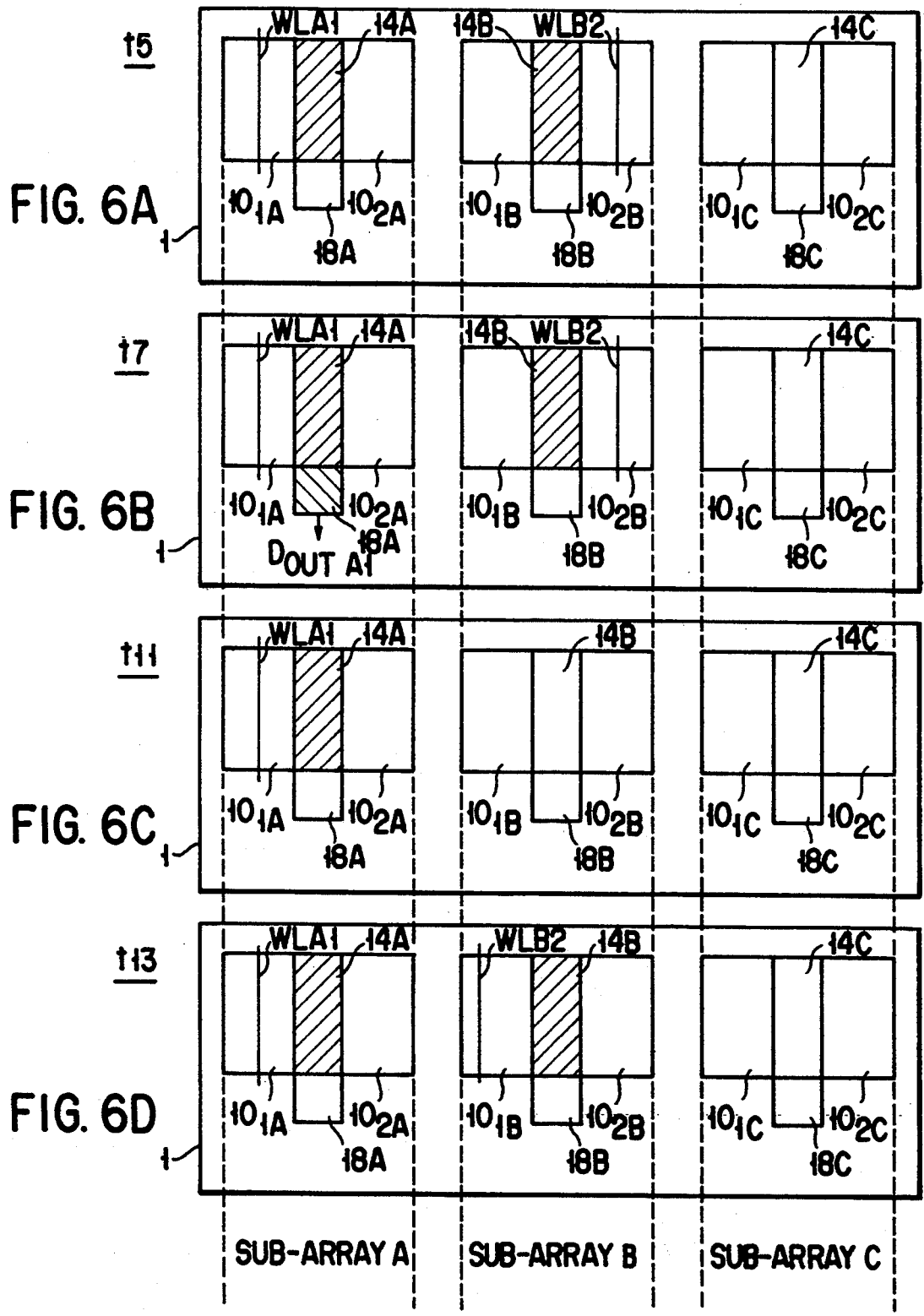

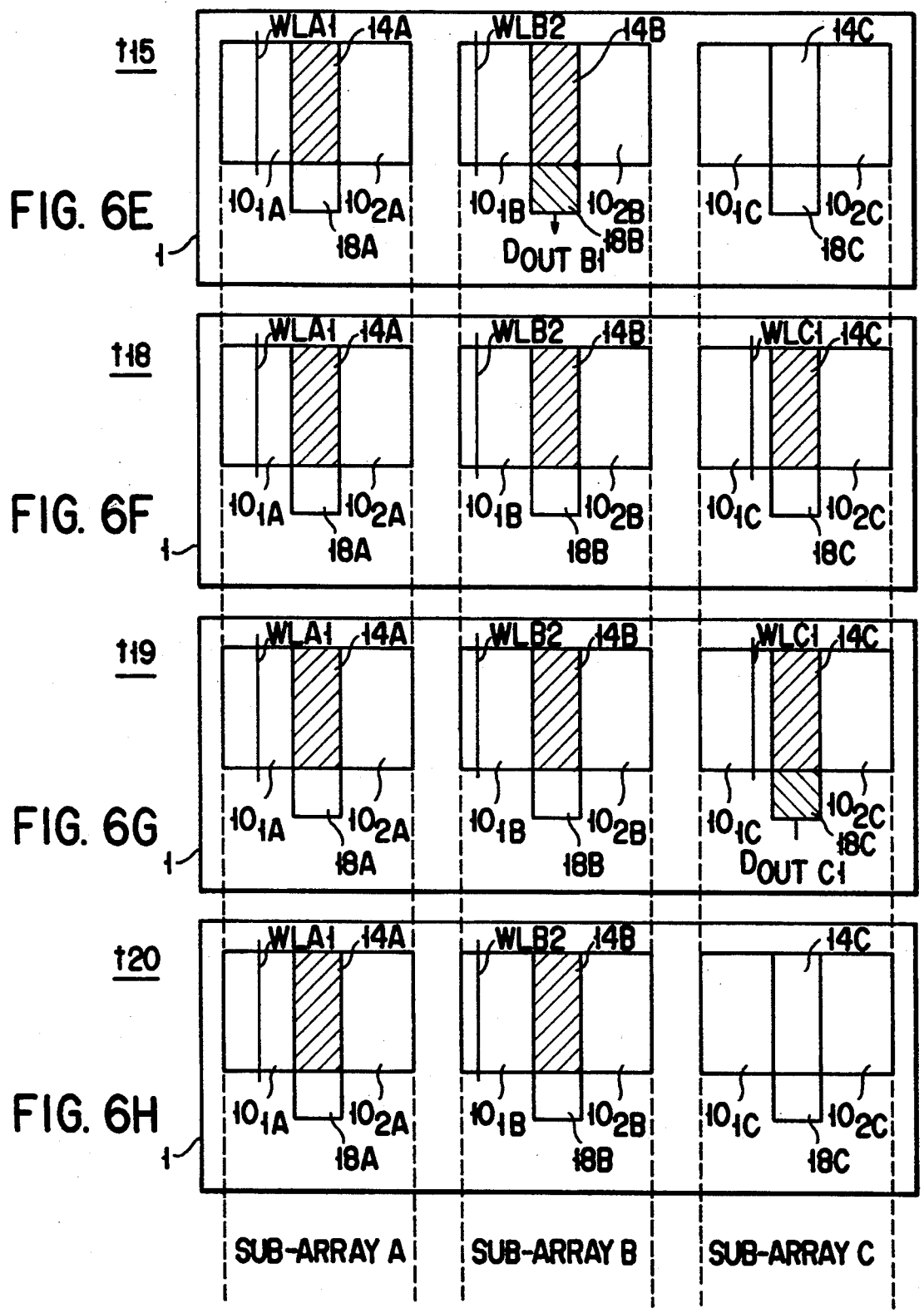

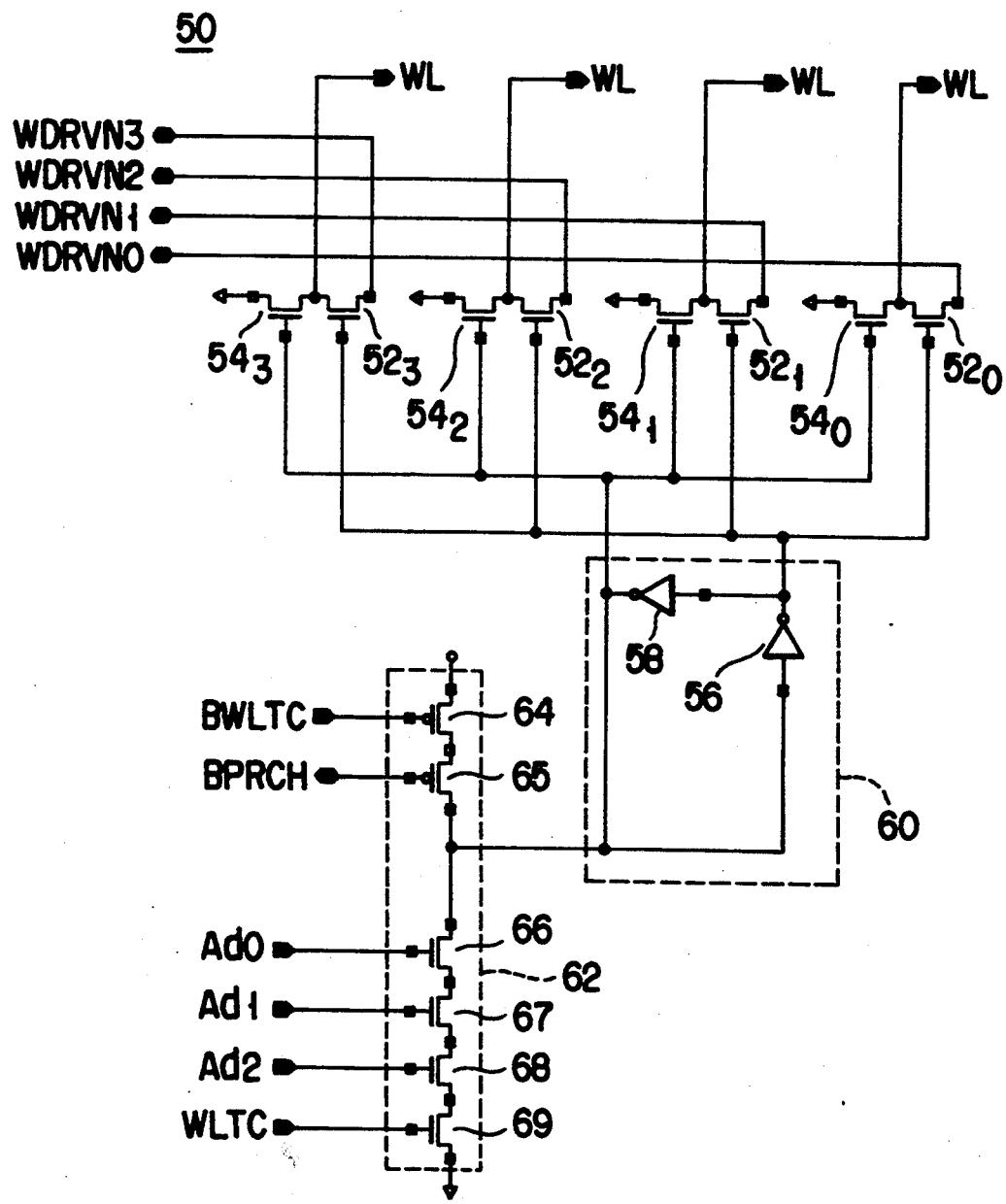
F I G. 10

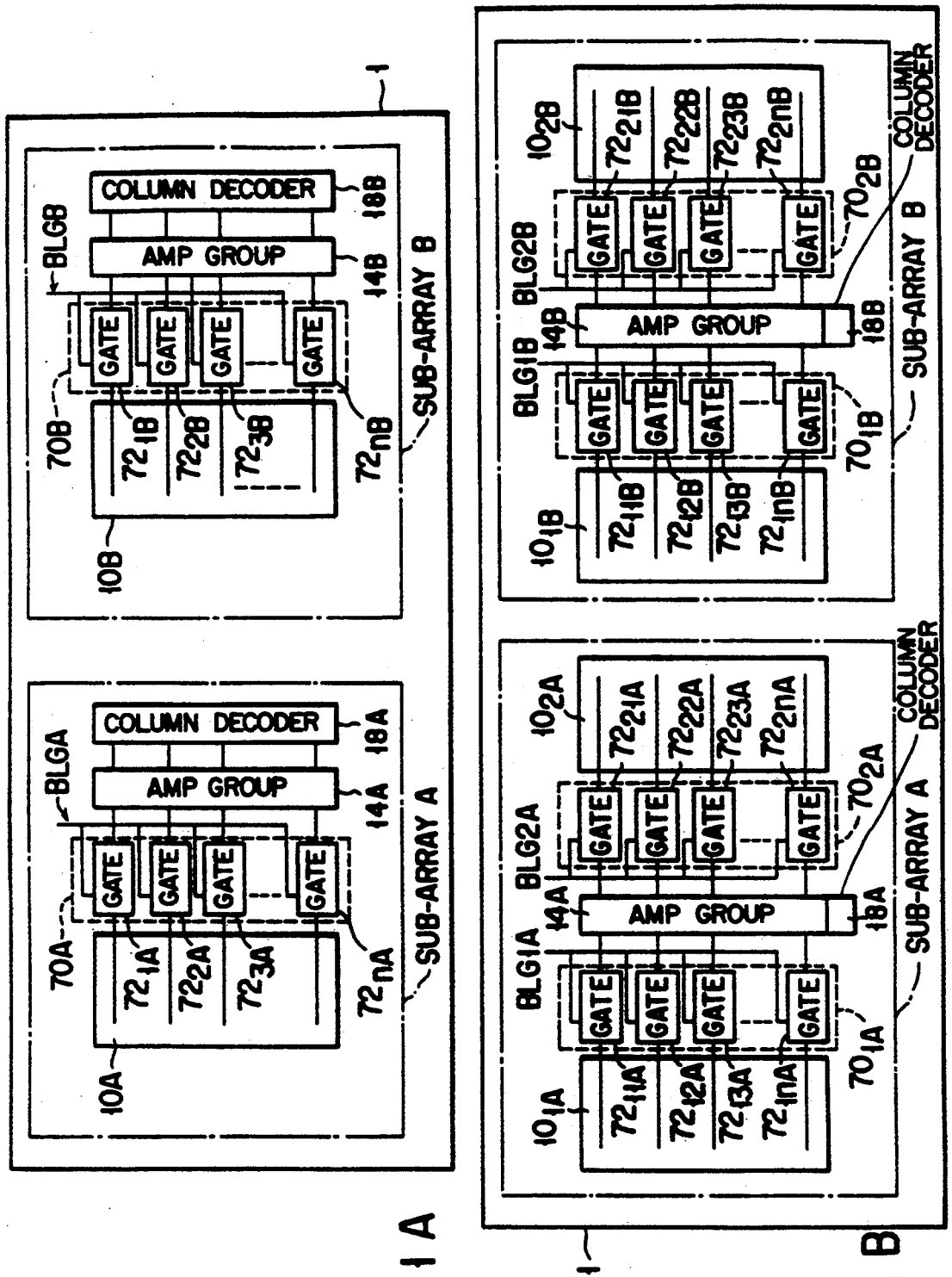
F I G. 11A
F I G. 11B

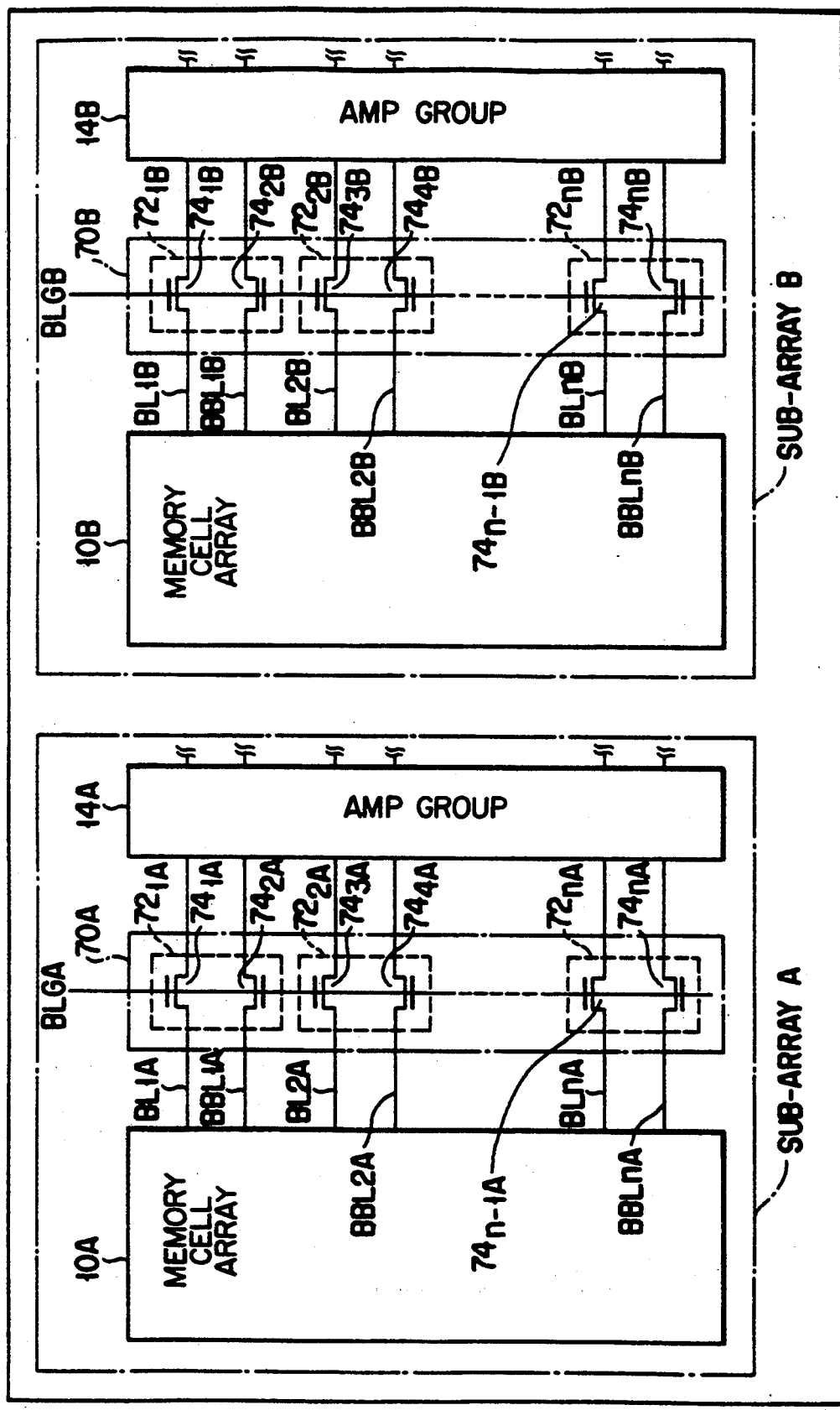
F I G. 12

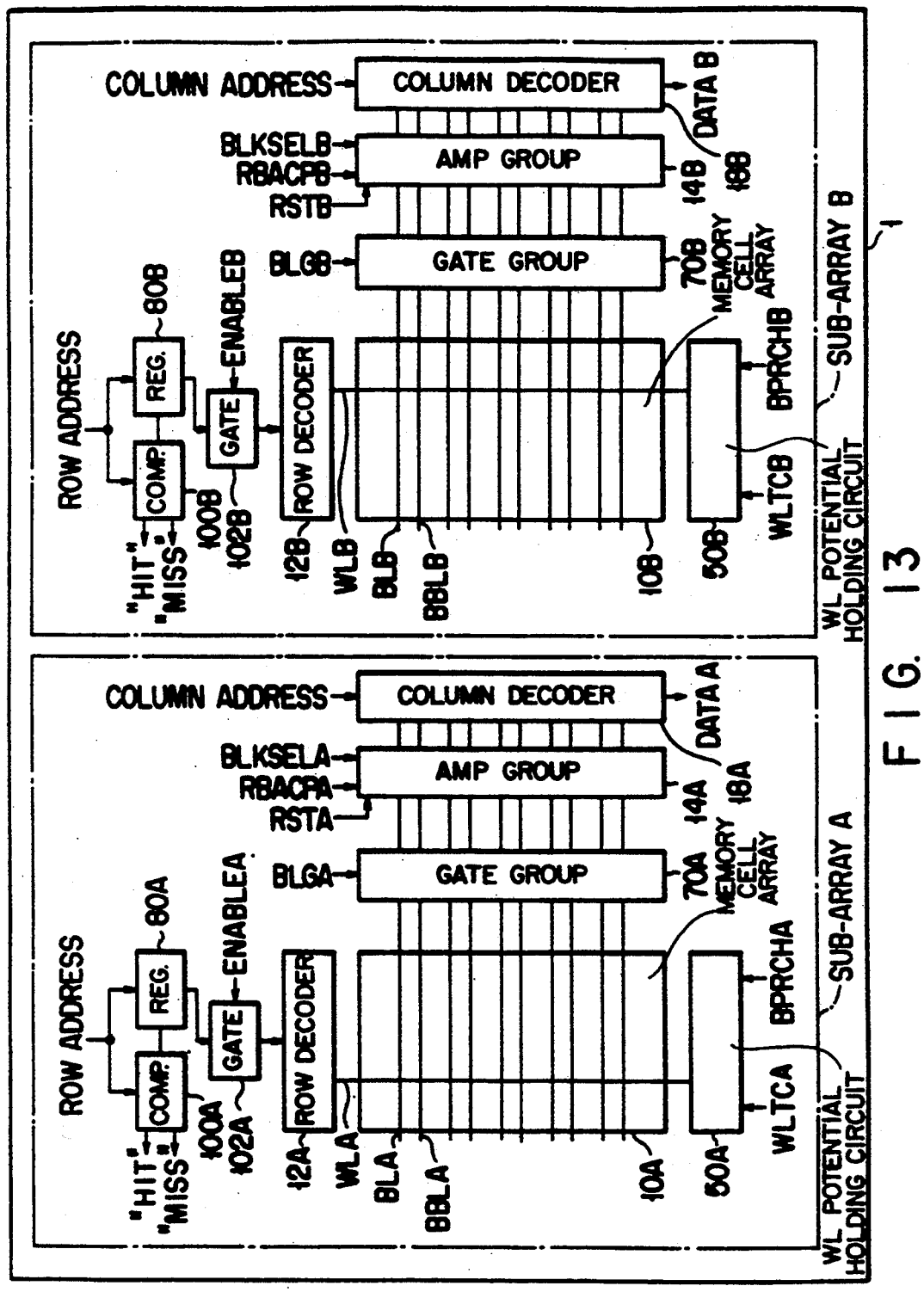
F I G. 13

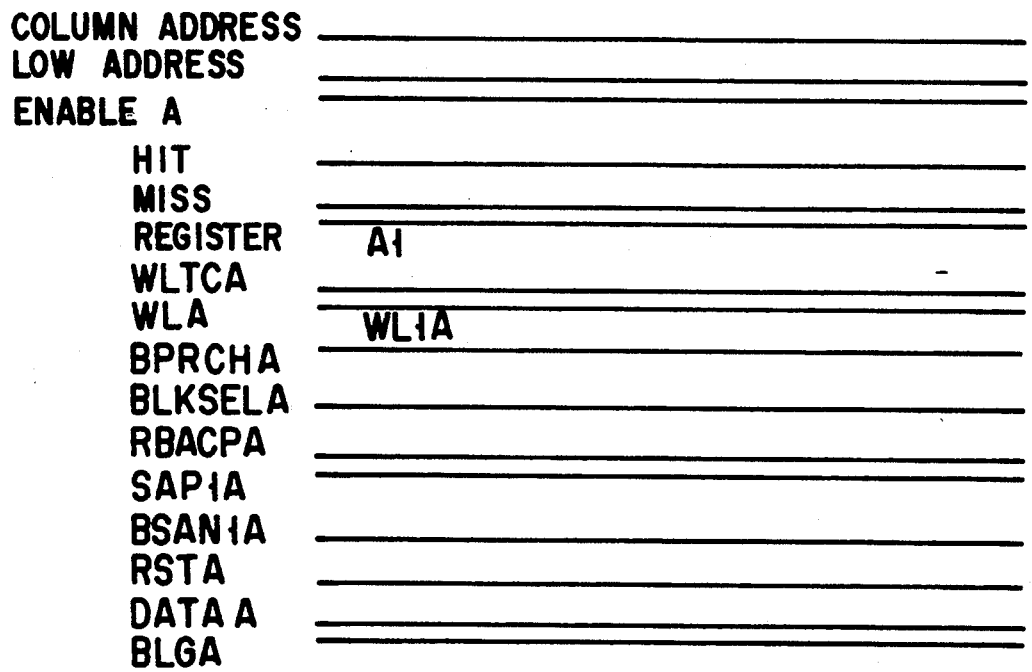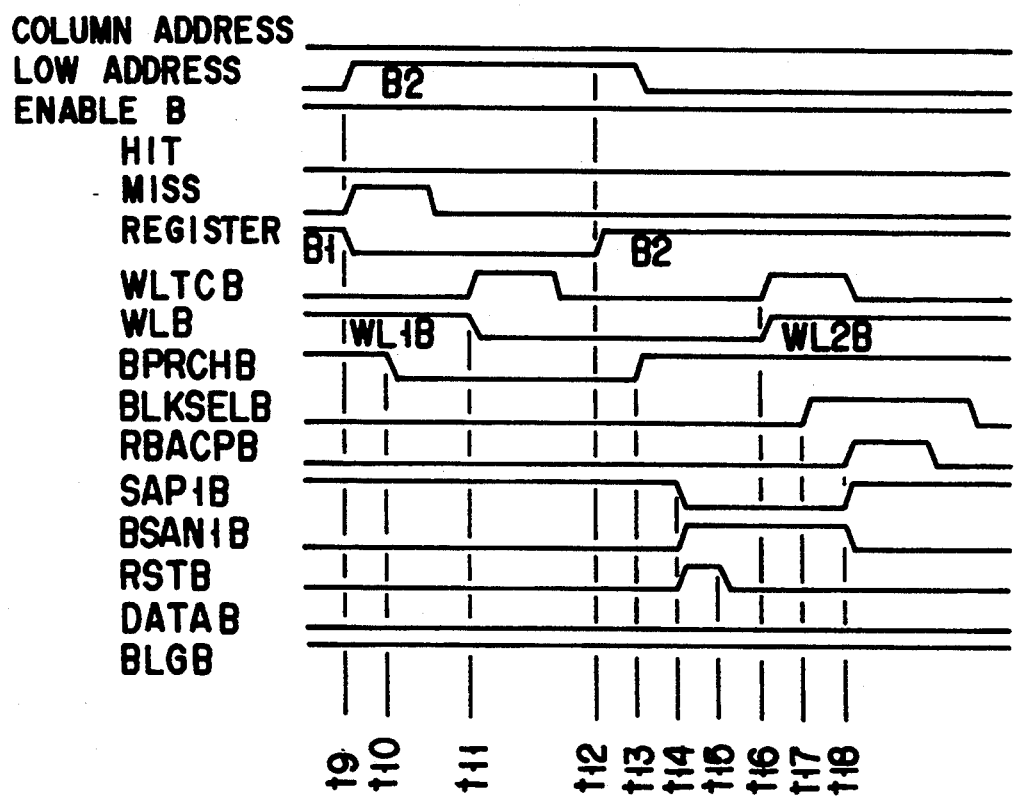
FIG. 14B

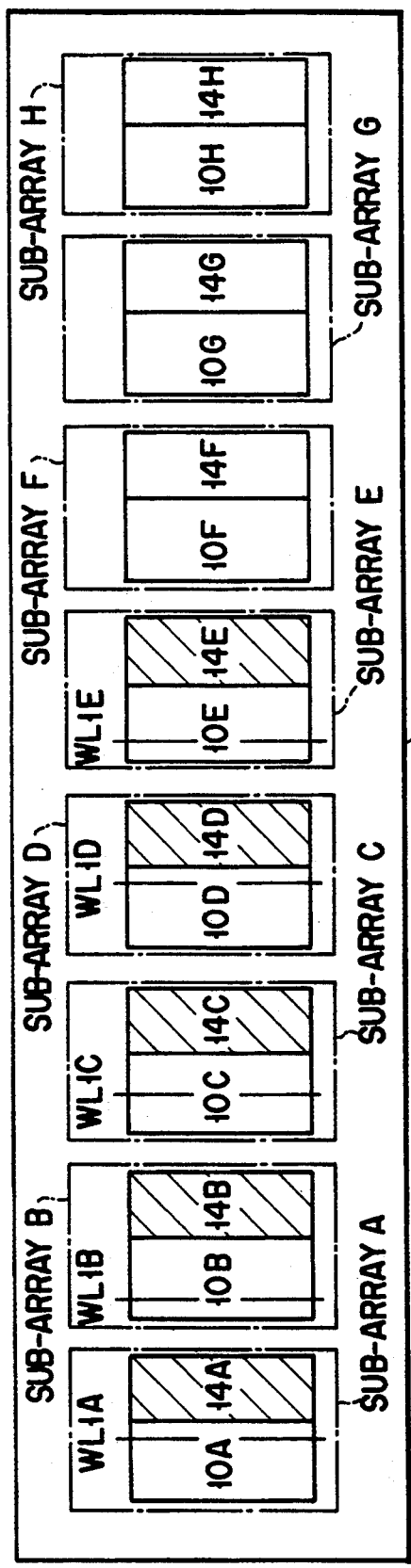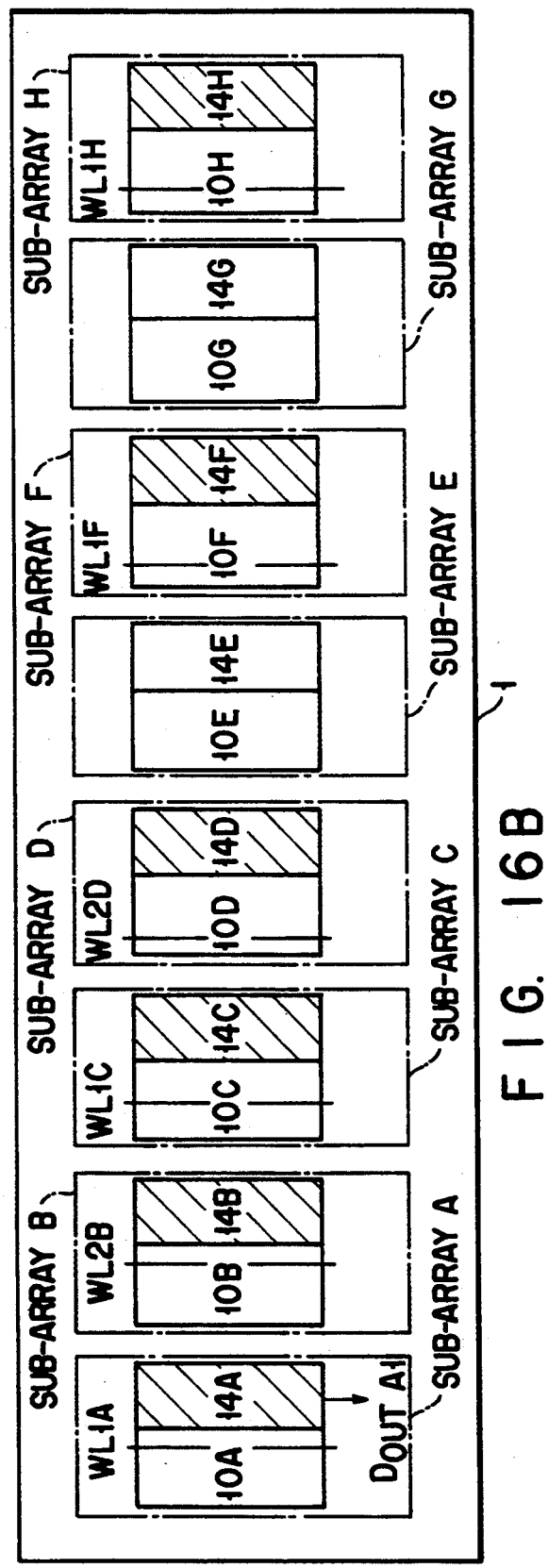

SEMICONDUCTOR MEMORY DEVICE

BACKGROUND OF THE INVENTION

1. Field of the Invention

This invention relates to a semiconductor memory device, and more particularly to the improvement of data access time.

2. Description of the Related Art

In a computer, the operation speed of a memory cannot follow the improvement of the operation speed of a central processing unit (CPU) and a difference between the operation speeds thereof tends to become larger. Therefore, it has been required to develop a memory having a shorter data access time.

A page mode is provided as an operation mode for enhancing the operation speed. The page mode is a method for designating a column address with one row address kept unchanged.

Since, in the page mode, one row is set in the selected state, data can be read out simply by designating a column address so that time required for row selection can be omitted and the data access time can be reduced.

However, in the page mode, only one row can be selected and requested data access is not always associated with the selected row. Therefore, each time a different row is selected, time from selection of the row until data is output from the memory becomes longer.

In the page mode, the probability (hit rate) that data access associated with the selected row is requested (this is hereinafter referred to as "hit") is low. Therefore, the average of data access times taken when data access to a row different from the selected row is requested (this is hereinafter referred to as "miss") and access times taken in the case of "hit", that is, the average of the total data access times becomes long, and as a result, the effect of reducing the data access time cannot be significantly improved.

SUMMARY OF THE INVENTION

This invention has been made to solve the above problem and an object of this invention is to provide a semiconductor memory in which the hit rate can be enhanced and the data access time can be reduced.

In this invention, in order to attain the above object, one memory area is divided into a plurality of sub-arrays. A plurality of amplifiers for amplifying data read out from a corresponding memory cell are provided for respective sub-arrays. The amplifiers hold data read out from the memory cells.

In this invention, the hit rate is enhanced to reduce data access time by dividing one memory area into a plurality of sub-arrays and independently operating each of the sub-arrays.

That is, in this invention, since the amplifiers hold data items derived from rows corresponding to different addresses for every preset number of sub-arrays, the probability that data access associated with the selected row is requested, that is, the hit rate can be enhanced. Therefore, the average value of total data access times taken in the cases of "hit" and "miss" can be reduced.

Further, cell data derived from a row is held in the amplifier and data to be read out is set in the amplifier. Therefore, time (data access time) from occurrence of the access request until data is output can be reduced even in comparison with a system in which a word line is specified after the access request occurs and data is read out from a memory cell connected to the specified word line and output.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a memory section of a DRAM according to a first embodiment of this invention;

FIGS. 5A to 5H are diagrams schematically showing the states of a device according to the first embodiment at the respective timings shown in FIG. 4;

FIGS. 6A to 6H are diagrams schematically showing the states of a device according to the first modification of this invention at the respective timings shown in FIG. 4;

FIG. 10 is a circuit diagram showing a word line potential holding circuit;

FIG. 11A is a diagram showing a floor plan of a DRAM according to a third embodiment of this invention;

FIG. 11B is a diagram showing another floor plan of the DRAM according to the third embodiment of this invention;

FIG. 12 is a circuit diagram showing a bit line gate;

FIG. 13 is a diagram showing a floor plan of a DRAM according to a fourth embodiment of this invention;

FIGS. 14A to 14E are timing charts for illustrating the operation of the DRAM according to the fourth embodiment of this invention;

FIGS. 16A and 16B are diagrams showing a floor plan of a DRAM according to a third modification of this invention at different timings;

DETAILED DESCRIPTION OF THE PREFERRED EMBODIMENTS

Figure 2:
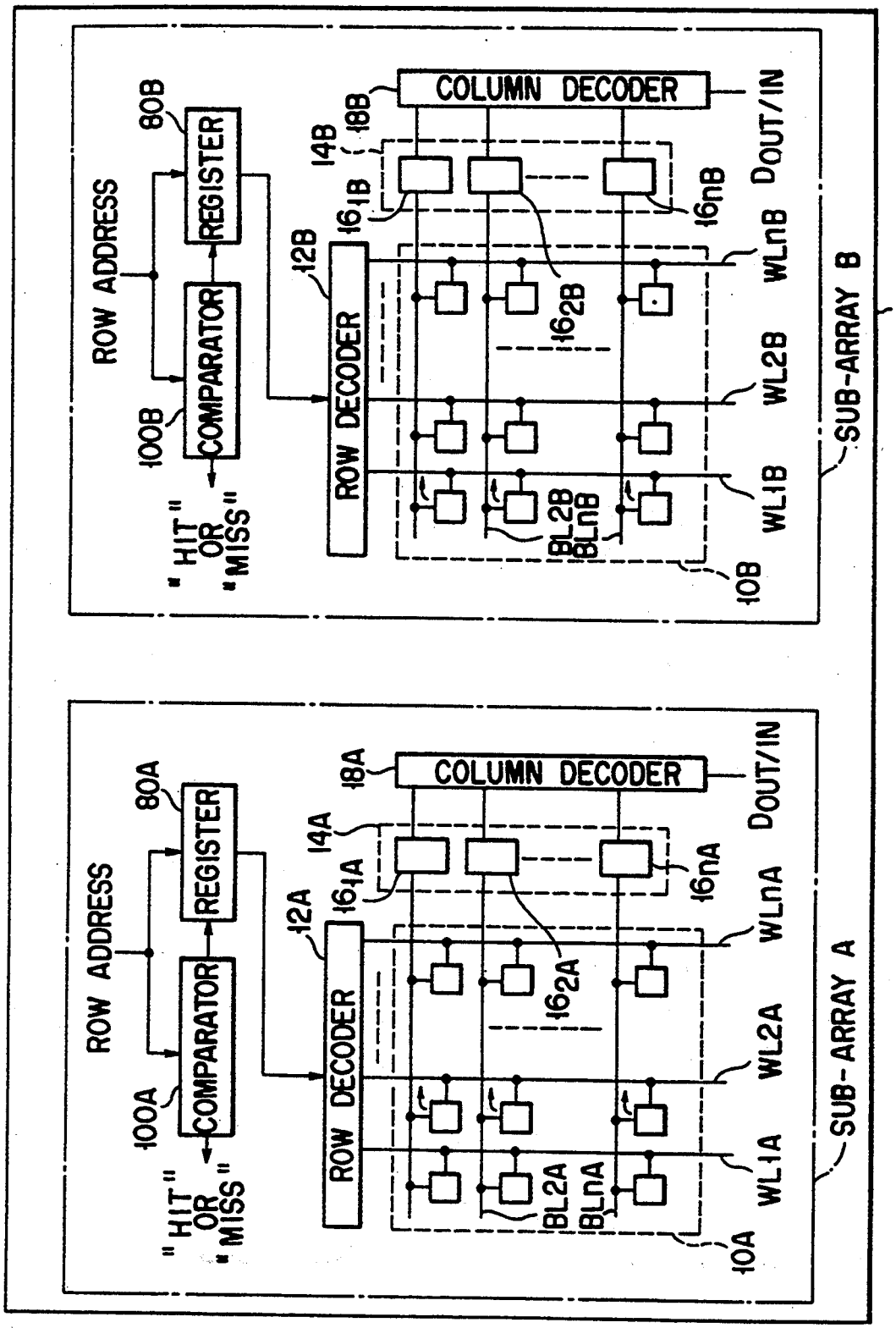
FIG. 2 is a diagram showing a floor plan of the DRAM according to the first embodiment of this invention.

There will now be described an embodiment of this invention with reference to the accompanying drawings. In the following explanation, portions which are the same throughout the drawings are denoted by use of the same reference numerals and the repetitive explanation therefor is omitted.

FIG. 1 is a block diagram showing a memory section of a DRAM according to a first embodiment of this invention, and FIG. 2 is a diagram showing a floor plan of the DRAM according to the first embodiment of this invention.

As shown in FIG. 1, a memory cell array 10 has a plurality of memory cells (11) to (nn) arranged in a matrix form. Word lines $WL_1$ to $WL_n$ are provided for respective rows of the memory cell array 10. The word line $WL_1$ is connected to the cells (11), (12) to (1n) arranged on the same row, the word line $WL_2$ is connected to the cells (21), (22) to (2n) arranged on the same row, and the word line $WL_n$ is connected to the cells (n1), (n2) to (nn) arranged on the same row. Bit lines $BL_1$ to $BL_n$ are provided for respective columns of the memory cell array 10. The bit line $BL_1$ is connected to the cells (11), (21) to (n1) arranged on the same column, the bit line $BL_2$ is connected to the cells (12), (22) to (n2) arranged on the same column, and the bit line $BL_n$ is connected to the cells (1n), (2n) to (nn) arranged on the same column. The word lines $WL_1$ to $WL_n$ are connected to a row decoder 12 and the bit lines $BL_1$ to $BL_n$ are connected to an amplifier group 14. The amplifier group 14 includes amplifiers $16_1$ to $16_n$ for amplifying data read out from the cells (11) to (nn) for the respective bit lines $BL_1$ to $BL_n$. The bit lines $BL_1$ to $BL_n$ are connected to a column decoder 18 via the amplifiers $16_1$ to $16_n$. The row decoder 12 is connected to a register 80 for storing a row address. The register 80 is supplied with a row address. A comparator 100 which is connected to the register 80 is supplied with a row address and compares the input row address with a row address stored in the register 80.

In the semiconductor device according to this invention, a row (word line) is selected (in the case of FIG. 1, the word line $WL_2$ is selected), and data items stored in the cells (in the case of FIG. 1, cells (21), (22) to (2n)) connected to the selected row are transferred to and held in the respective amplifiers $16_1$ to $16_n$. The amplifiers $16_1$ to $16_n$ each have a function of continuously holding data and the amplifier group 14 is set in the standby state for output. A row address corresponding to the selected row is stored in the register 80. When an access request is made with respect to the memory section, the comparator 100 compares a row address contained in the access request with a row address stored in the register 80, and generates a hit signal indicating occurrence of "hit" when the compared addresses coincide with each other and generates a miss signal indicating occurrence of "miss" when the compared addresses do not coincide with each other.

When a hit signal is generated from the comparator 100, data is output simply by selecting a column by use of a column address without newly selecting a row by use of a row address. Further, when a miss signal is generated from the comparator 100, the row address stored in the register 80 is replaced by a row address contained in the access request, then a row selected by use of the thus replaced row address, and a column is selected by use of the column address so as to read out data.

In the above operation system, time required for selecting a row can be reduced in comparison with a system in which data is output by selecting a row and a column after a data access request has occurred. Therefore, time from occurrence of the access request until data is output, or the access time can be reduced. Although an access request is not always made with respect to the selected row, the probability that an access request is successively made to the same row is extremely high in the semiconductor memory device, and even if a case wherein an access request is made to a non-selected row (a case of "miss") is taken into consideration, the average value of total data access times taken in the cases of "hit" and "miss" can be reduced.

Further, since the register 80 is provided and a row address corresponding to the selected row is stored in the register 80, it is possible to instantaneously obtain information on a row corresponding to data items stored in the amplifier group 14 and further enhance the access speed.

In the case of "miss", a row is newly selected, and at this time, cell data items of respective cells connected to the newly selected row are held in the respective amplifiers $16_1$ to $16_n$ to set the amplifier group 14 in the standby state for output by taking a next access request into consideration. The newly selected row address is kept stored in the register 80. As a result, the probability (hit rate) that a next access request is hit can be enhanced.

Further, in this invention, in order to enhance the hit rate, a plurality of memory sections having the same construction as the memory section as shown in FIG. 1 are provided on one chip as shown in FIG. 2, and thus the concept of sub-array is adopted. In sub-arrays A and B, data items which may correspond to different row addresses can be respectively held in amplifiers $16_1A$ to $16_nA$ and $16_1B$ to $16_nB$. Thus, amplifier groups 14A and 14B can be set in the standby state so as to make ready for output of cell data items of rows corresponding to different row addresses. As shown in FIG. 2, in the sub-array A, the word line $WL_2A$ is set in the selected state, data items of cells connected to the word line $WL_2A$ are held in the amplifiers $16_1A$ to $16_nA$, and in the sub-array B, the word line $WL_1B$ is set in the selected state, data items of cells connected to the word line $WL_1B$ are held in the amplifiers $16_1B$ to $16_nB$. Thus, the hit rate can be enhanced by simultaneously setting a plurality of rows corresponding to different addresses in the selected state. Further, registers 80A and 80B for storing row addresses of selected rows are provided for the respective sub-arrays. Likewise, comparators 100A and 100B are provided for the respective sub-arrays.

With the construction of FIG. 2, in the case of "miss", it is possible to newly select a row only in a sub-array in which the "miss" occurs. Thus, it is not necessary to newly select all of the rows in each case of "miss" and the data holding states of the amplifier can be more variously set in comparison with a case wherein all of the rows are newly selected. If the data holding states can be variously set, the hit rate can be enhanced.

Figure 3:
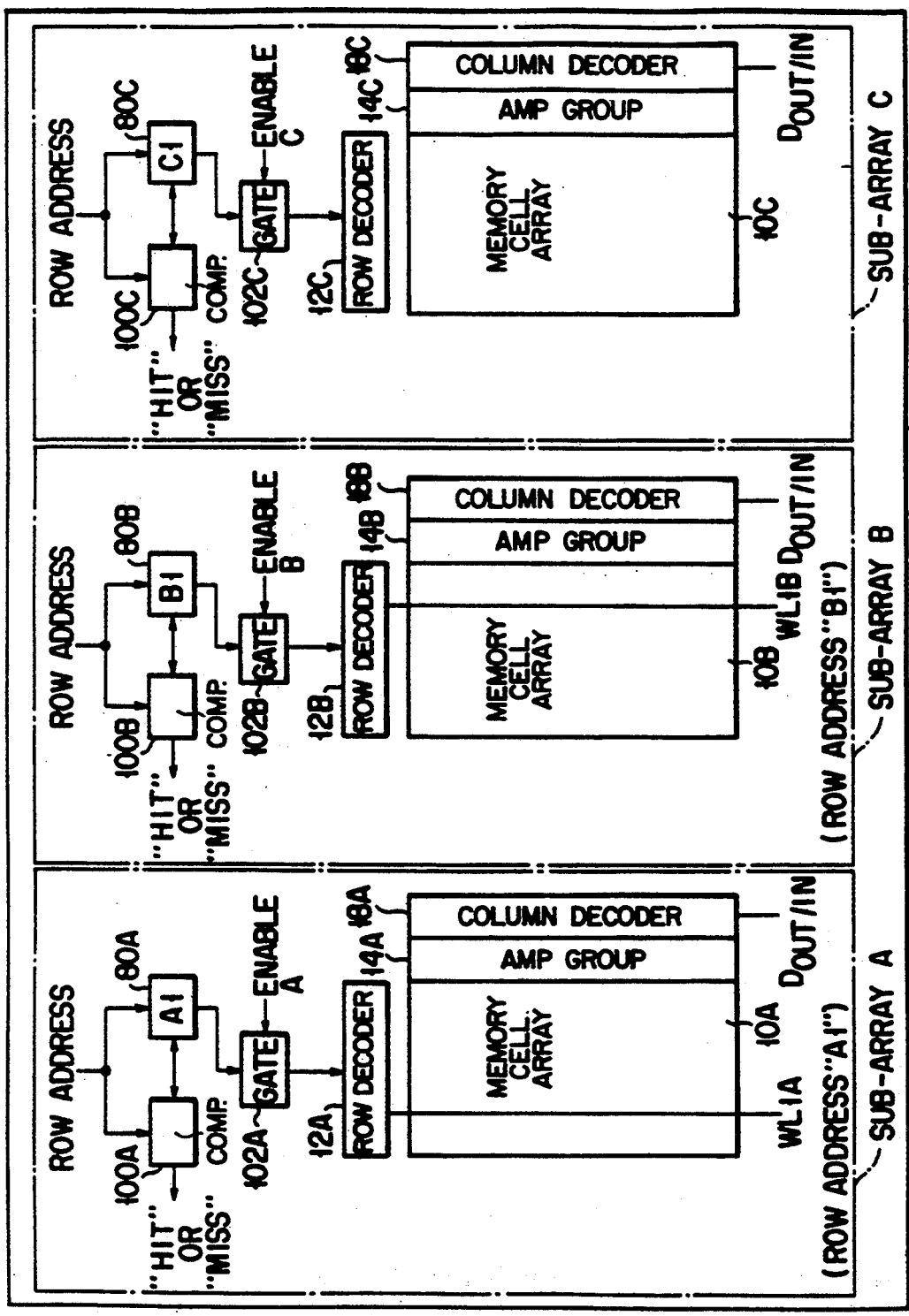
FIG. 3 is a diagram showing another floor plan of the DRAM according to the first embodiment of this invention.

Further, as shown in FIG. 3, in a plurality of sub-arrays A, B and C, a sub-array (sub-array C in the case of FIG. 3) which does not hold data may be provided. At this time, gates 102A to 102C are provided between the registers 80A to 80C and the row decoders 12A to 12C. The gates 102A to 102C are respectively controlled by register decoder connection enable signals ENABLE-A to ENABLE-C. The enable signals ENABLE-A, ENABLE-B and ENABLE-C can be replaced by address signals. An address signal A1, for example, may be used to designate an address in the sub-array A. If the address signal A1 is input to the gate 102A, turning on this gate 102A, the register 80A and the row decoder 12A, both included in the sub-array A, will be electrically connected. It becomes possible to provide a sub-array, for example, the sub-array C which does not hold data in the sub-arrays A, B and C as shown in FIG. 3 by using the gates 102A to 102C to electrically connect the register to the decoder or electrically disconnect the register from the decoder.

Next, the operation of a DRAM according to a first embodiment of this invention is explained with reference to FIGS. 3, 4 and 5A to 5H.

Figure 4:
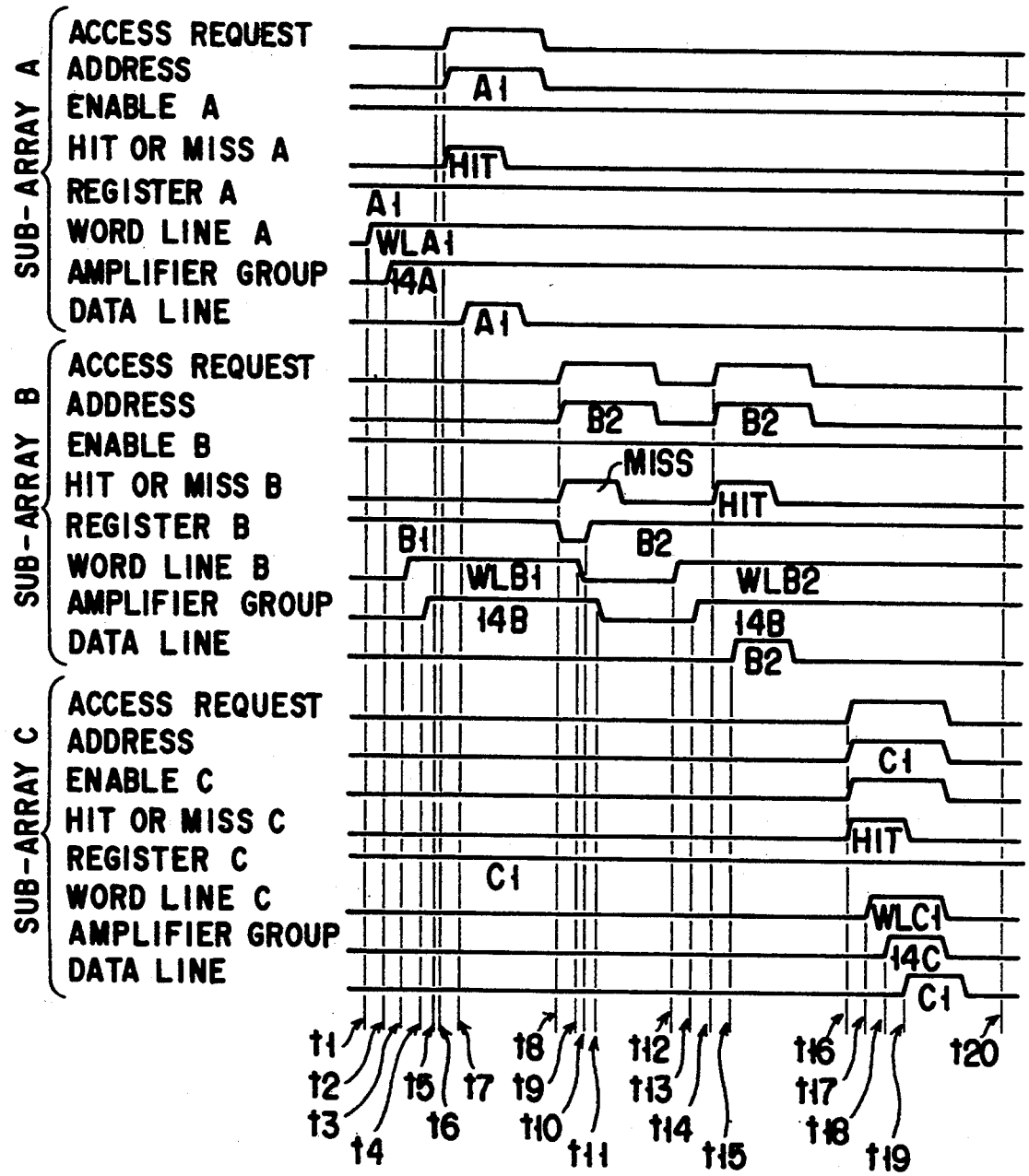
FIG. 4 is a timing chart for illustrating the operation of the DRAM according to the first embodiment of this invention.

FIG. 4 is a timing chart for illustrating the operation of the DRAM shown in FIG. 3 and FIGS. 5A to 5H are diagrams schematically showing the states of the DRAM at the main timings among the timings shown in FIG. 4. In FIGS. 5A to 5H, hatched blocks indicate the active state and blank blocks indicate the non-active state or precharged state, and only the word lines that are set in the selected state are shown.

In FIG. 4, a period from time t1 to time t4 indicates an initializing operation period. That is, in this period, a row corresponding to an address A1 stored in the address register is selected based on the address A1 at the time of turn-on of a power source switch, data items from cells connected to the selected row are held in the amplifier group to set each of the sub-arrays into the initial condition. First, in the sub-array A, the potential of a row (word line WLA1) corresponding to the address A1 is raised according to the address A1 stored in the address register at the time t1, the amplifier group 14A is activated at the time t2, data items are read out from cells connected to the selected row (WLA1) and held in the amplifier group 14A. As a result, the amplifier group 14A is set into the standby state for output. Also, in the sub-array B, as shown by times t3 and t4, the same operation effected at the times t1 and t2 is effected, data items of cells connected to a row (WLB1) corresponding to an address B1 are held in the amplifier group 14B and then the amplifier group 14B is set into the standby state for output. In the amplifier group C of the sub-array C, an address C1 is stored in the address register, but a signal (ENABLE C) for permitting the electrical connection between the register and the decoder is set at the "L" level to disable the gate 102C so as to prevent data items from being held into the amplifier group 14C.

In FIG. 4, a period from time t5 to time t6 indicates a data readout period. The state of the device at the time t5 is shown in FIG. 5A. Assume that an access request containing the row address A1 is made with respect to the sub-array A at the time t6. The comparator 100A compares the row address A1 with a row address stored in the register 80A and then outputs a signal indicating a case of "hit" after recognizing that the compared addresses coincide with each other. The column decoder effects only the operation of selecting a corresponding column according to column data contained in the access request and outputs an output $D_{out}A1$ at time t7 (FIG. 5B). While the above operations are effected, data of the cells held in the amplifier group 14B are kept held irrespective of the operation of the amplifier group 14A.

Further, assume that an access request containing a row address B2 is made with respect to the sub-array B at time t8. The comparator 100B compares the row address B2 with a row address stored in the register 80B. Since the row address B1 is stored in the register 80B, the result of comparison indicates non-coincidence. The comparator 100B recognizes the non-coincidence and outputs a signal indicating a case of "miss". In response to the miss signal, the register 80B is precharged and a new address B2 is written into the register 80B at time t10 and stored therein. At time t9 between the times t8 and t10, the potential of the word line WLB1 is lowered. Further, in response to a fall of the potential of the word line WLB1, the amplifier group 14B is precharged at time t11 (FIG. 5C). Then, the potential of a row (word line WLB2) corresponding to the row address B2 is raised at time t12 and the amplifier group 14B is activated again at time t13 (FIG. 5D). After this, an access request containing the row address B2 is made again at time t14. The comparator 100B compares the row address B2 with a row address stored in the register 80B and outputs a signal indicating a case of "hit" after recognizing that the compared addresses coincide with each other. The column decoder effects the operation of selecting a corresponding column according to column data contained in the access request and outputs an output $D_{out}B2$ at time t15 (FIG. 5E). While the above operations are effected, data of the cells held in the amplifier group 14A are kept held irrespective of the operation of the the amplifier group 14B. In this case, data items of cells connected to the row (WLB2) whose potential is raised are held in the amplifier group 14B which is set in the standby state for a next access request.

Further, assume that an access request containing a row address C1 is made with respect to the sub-array C at time t16. The comparator 100C compares the row address C1 with a row address stored in the register 80C and outputs a signal indicating a case of "hit" after recognizing that the compared addresses coincide with each other. Then, a signal (ENABLE C) for permitting the electrical connection between the register 80C and the decoder 12C is raised to an active level to electrically connect the decoder 12C to the register 80C, thereby permitting a row address to be transferred from the register 80C into the decoder 12C. As a result, the potential of a row (WLC1) corresponding to the address C1 is raised at time t17 and the amplifier group 14C is activated at time t18 (FIG. 5F). After this, a corresponding column is selected according to column data contained in the access request and an output D out C1 is output at time t19 (FIG. 5G).

The state of the device at time t20 after a sequence of the above operations is completed is shown in FIG. 5H. The DRAM according to the first embodiment of this invention is operated at the above timings.

Next, a first modification of this invention is explained. FIGS. 6A to 6H are diagrams schematically showing the states of a device according to the first modification of this invention at the respective timings shown in FIG. 4.

In the first embodiment, each of the memory cell arrays 10A to 10C is connected to a corresponding one of the amplifier groups 14A to 14C, but it is possible to provide two memory cell arrays $10_1A$ and $10_2A$ which commonly use a single amplifier group 14A, two memory cell arrays $10_1B$ and $10_2B$ which commonly use a single amplifier group 14B, and two memory cell arrays $10_1C$ and $10_2C$ which commonly use a single amplifier group 14C.

In FIGS. 6A to 6H, portions which are the same as those shown in FIGS. 5A to 5H are denoted by the same reference numerals and the explanation therefor is omitted.

Next, the amplifier group 14 is explained.

Figure 7:
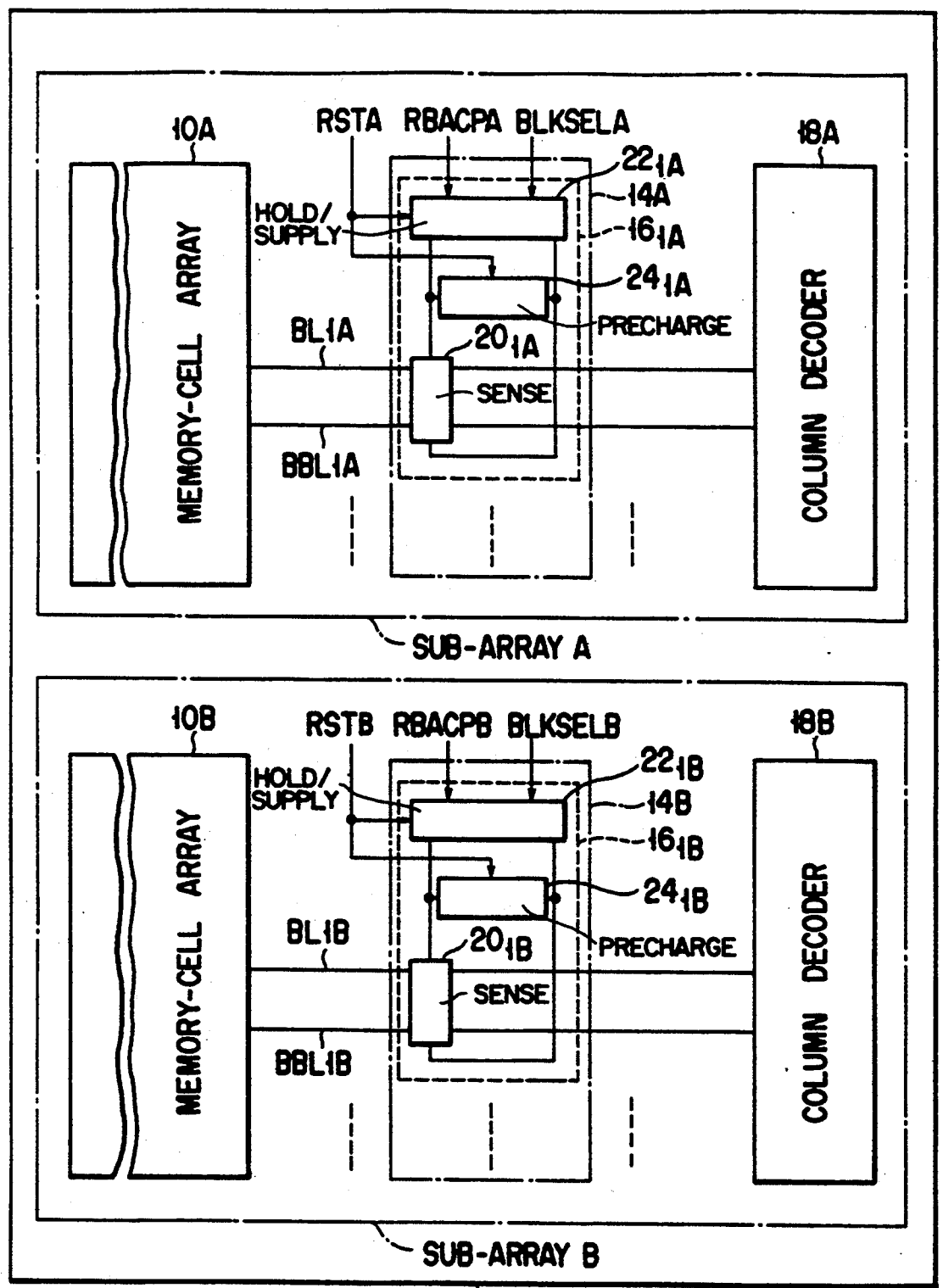
FIG. 7 is a block diagram showing an example of the construction of an amplifier.
Figure 8:
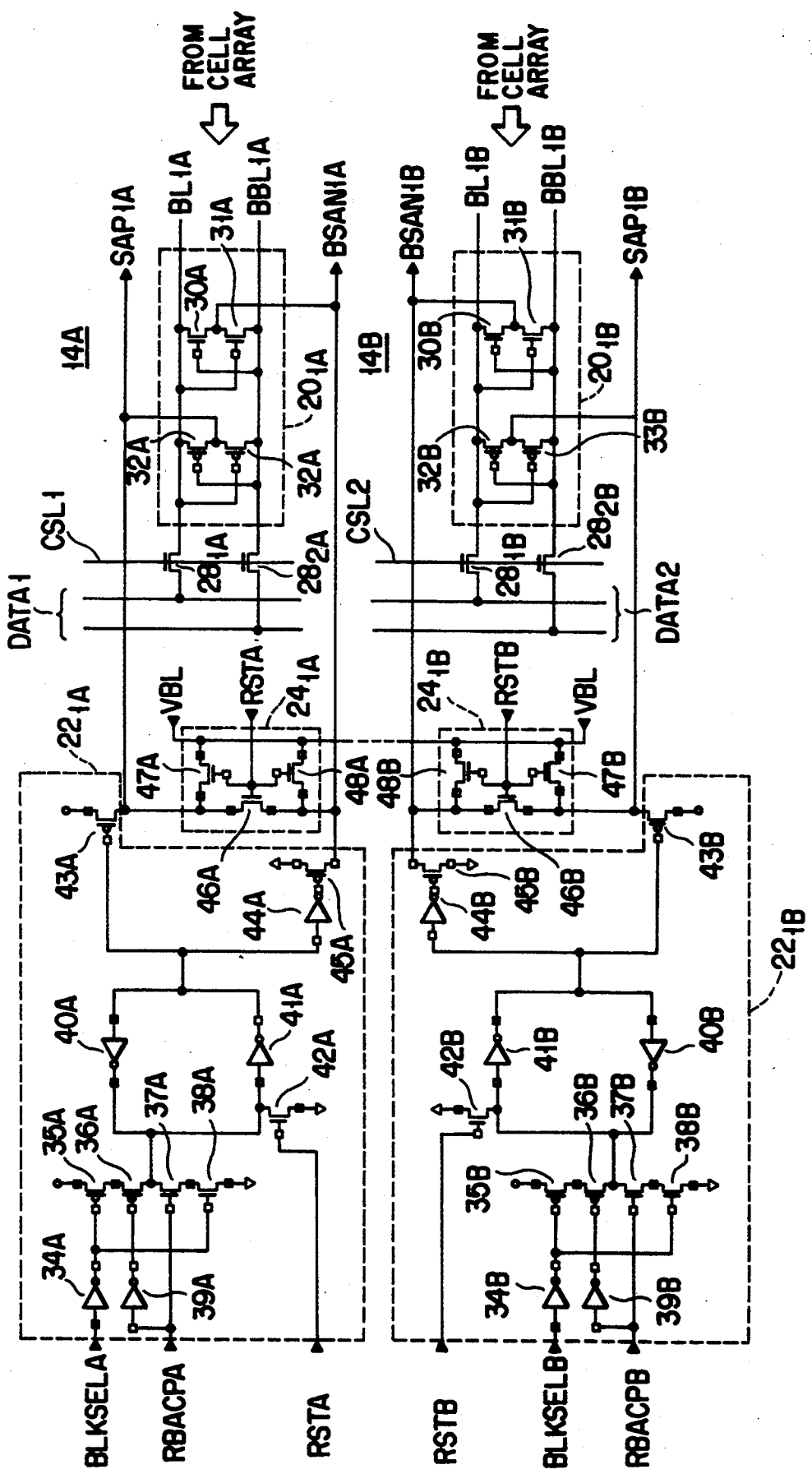
FIG. 8 is a circuit diagram showing the circuit of the amplifier shown in FIG. 7.

FIG. 7 is a block diagram showing a concrete example of the construction of the amplifier group 14. FIG. 8 is a circuit diagram showing the amplifier group of FIG. 7.

As shown in FIG. 7, amplifiers $16_1A$, ---, $16_1B$, --- are sense amplifiers. The amplifiers $16_1A$, ---, $16_1B$,--- subject data items supplied from the respective cell arrays via bit lines $BL_1A$, ---, $BL_1B$, ---and inverted signal bit lines $BBL_1A$, ---, $BBL_1B$, --- to the differential amplification. The data items subjected to the differential amplification are output via an output circuit (not shown) after a corresponding column is selected by the column decoder. The amplifiers $16_1A$, ---, $16_1B$, --- are constructed by sense circuits $20_1A$, ---, $20_1B$, --- which are connected to bit line pairs BL and BBL, potential holding/supplying circuits $22_1A$, ---, $22_1B$, --- which supply high and low potentials to the sense circuits $20_1A$, ---, $20_1B$, --- and hold the potentials, and precharge circuits $24_1A$, ---, $24_1B$, ---for equalizing the high and low potentials to precharge the amplifiers $16_1A$, ---, $16_1B$, ---. The amplifier groups 14A and 14B are constructed by combinations of the amplifiers $16_1A$, ---, $16_1B$, --- with the above construction.

The potential holding/supplying circuits $22_1A$, ---, $22_1B$, --- are respectively supplied with signals BLKSELA, BLKSELB for selecting an amplifier group to be activated, signals RBACPA, RBACPB for determining timings at which the signals RBACPA, RBACPB are received, and signals RSTA, RSTB for precharging the amplifiers $16_1A$, ---, $16_1B$, ---. Further, the signals RSTA, RSTB are respectively supplied to the precharge circuits $24_1A$, ---, $24_1B$, ---.

As shown in FIG. 8, the sense circuit 201A is constructed by N-channel MOSFETs (which are hereinafter referred to as NMOSs) 30A, 31A serially connected between the bit line $BL_1A$ and the inverted signal bit line $BBL_1A$ and P-channel MOSFETs (which are hereinafter referred to as PMOSs) 32A, 33A serially connected between the bit line $BL_1A$ and the inverted signal bit line $BBL_1A$. The gate of the NMOS 30A which is connected at one end to the bit line $BL_1A$ is connected to the bit line $BBL_1A$ and the gate of the NMOS 31A which is connected at one end to the bit line $BBL_1A$ is connected to the bit line $BL_1A$. The gate of the PMOS 32A which is connected at one end to the bit line $BL_1A$ is connected to the bit line $BBL_1A$ and the gate of the PMOS 33A which is connected at one end to the bit line $BBL_1A$ is connected to the bit line $BL_1A$. An interconnection node between the NMOSs 30A and 31A is connected to a power source line $BSAN_1A$ and an interconnection node between the PMOSs 32A and 33A is connected to a power source line $SAP_1A$. One-side ends of the bit lines $BL_1A$ and $BBL_1A$ are connected to a cell array (not shown). The other ends of the bit lines $BL_1A$ and $BBL_1A$ are connected to data lines DATA1 via selection gates $28_1A$ and $28_2A$ each formed of an NMOS.

The construction of the sense circuit $20_1B$ is substantially the same as that of the sense circuit $20_1A$, corresponding elements and signal lines are denoted by the same reference numerals each having a suffix "B" instead of a suffix "A", and the explanation thereof is omitted.

An input section of the potential holding/supplying circuit $22_1A$ includes an inverter 34A supplied with a signal BLKSELA for selecting a sense amplifier group to be activated, PMOSs 35A, 36A and NMOSs 37A, 38A serially connected between a high potential and a low potential (for example, ground potential) and an inverter 39A supplied with a timing signal RBACPA for determining a timing at which the signal BLKSELA is received. An output of the inverter 34A is connected to the gates of the PMOS 35A and NMOS 38A and an output of the inverter 39A is connected to the gate of the PMOS 36A. Further, the signal RBACPA is supplied to the gate of the PMOS 37A. An interconnection node between the PMOS 36A and NMOS 37A is connected to an interconnection node between an output of an inverter 40A and an input of an inverter 41A. The interconnection node between the output of the inverter 40A and the input of the inverter 41A is connected to one end of an NMOS 42A. A reset signal RSTA is supplied to the gate of the NMOS 42A and the other end of the NMOS 42A is connected to a low potential (for example, ground potential). An interconnection node between an output of the inverter 41A and an input of the inverter 40A is connected to the gate of a PMOS 43A and to the gate of PMOS 45A via an inverter 44A. One end of the PMOS 43A is connected to the high potential and the other end thereof is connected to a power source line $SAP_1A$. One end of the PMOS 45A is connected to the low potential (for example, ground potential) and the other end thereof is connected to a power source line $BSAN_1A$. The construction of the potential holding/supplying circuit $22_1B$ is substantially the same as that of the potential holding/supplying circuit $22_1A$, corresponding elements and signal lines are denoted by the same reference numerals each having a suffix "B" instead of a suffix "A", and the explanation thereof is omitted.

The precharge circuit $24_1A$ includes an NMOS 46A connected between the power source lines $SAP_1A$ and $BSAN_1A$, an NMOS 47A connected at one end to an interconnection node between the NMOS 46A and the power source line $SAP_1A$ and connected at the other end to a power source line VBL, and an NMOS 48A connected at one end to an interconnection node between the NMOS 46A and the power source line $BSAN_1A$ and connected at the other end to the power source line VBL. The gates of the NMOSs 46A, 47A, 48A are supplied with the reset signal RSTA. The construction of the precharge circuit $24_1B$ is substantially the same as that of the precharge circuit $24_1A$, corresponding elements and signal lines are denoted by the same reference numerals each having a suffix "B" instead of a suffix "A", and the explanation thereof is omitted.

Next, a DRAM according to a second embodiment of this invention is explained.

Figure 9:
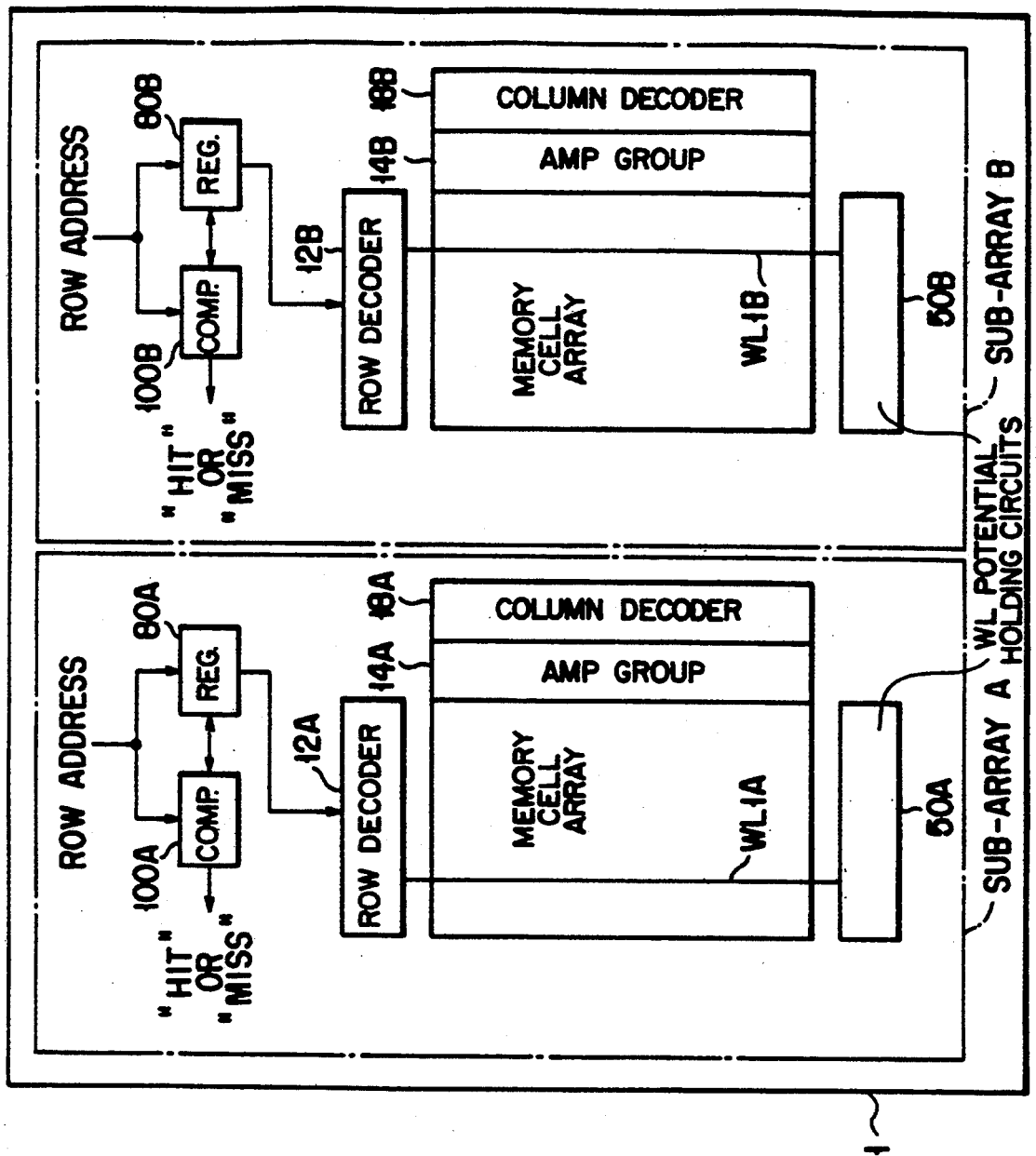
FIG. 9 is a diagram showing a floor plan of a DRAM according to a second embodiment of this invention.

FIG. 9 is a diagram showing a floor plan of the DRAM according to the second embodiment of this invention.

As shown in FIG. 9, the DRAM according to the second embodiment includes word line potential holding circuits 50A, 50B for holding the potential of the word line for each of the sub-arrays A, B as a means for keeping a state in which a desired row is selected. The word line potential holding circuits 50A, 50B are connected to one-side ends of the word lines which are connected at the other ends to respective row decoders 12A, 12B.

FIG. 10 is a circuit diagram of one of the word line potential holding circuits 50A, 50B shown in FIG. 9.

As shown in FIG. 10, NMOSs $52_0$, $54_0$ are serially connected between a word line driving potential WDRVN0 and a low potential (for example, ground potential), and an interconnection node between the NMOSs $52_0$, $54_0$ is connected to a word line $WL_0$. The gate of the NMOS $52_0$ is connected to an interconnection node between an output of an inverter 56 and an input of an inverter 58 and the gate of the NMOS $54_0$ is connected to an interconnection node between an output of the inverter 58 and an input of the inverter 56. The inputs of the inverters 56 and 58 are respectively connected to the outputs thereof to constitute a latch circuit 60. The potential of the word line is determined according to the data holding state of the latch circuit 60. The word line potential holding circuit includes an input section 62 for transferring latch data to the latch circuit 60 according to address signals Ad0 to Ad2 and word line latch signals WLTC, BWLTC (inverted signal of WLTC). The input section 62 includes a PMOSs 64, 65 and NMOSs 66 to 69 serially connected between the high potential and the low potential (for example, ground potential). A word line latch signal BWLTC is supplied to the gate of the PMOS 64, a precharge signal PRCH is supplied to the gate of the PMOS 65, address signals Ad0 to Ad2 are respectively supplied to the gates of the NMOSs 66 to 68, and a word line latch signal WLTC is supplied to the gate of the NMOS 69.

FIG. 11A is a diagram showing a floor plan of a DRAM according to a third embodiment of this invention and FIG. 11B is a diagram showing another floor plan of the DRAM according to the third embodiment of this invention.

As shown in FIG. 11A, the DRAM according to the third embodiment includes bit line gate groups 70A, 70B which are each connected between the bit lines and a corresponding one of the amplifier groups so as to permit the operation of the amplifier to be effected independently from the bit line potentials. In a case where one cell array 10A is provided for one amplifier group 14A and one cell array 10B is provided for one amplifier group 14B, the bit line gate groups 70A, 70B are respectively provided between the respective cell arrays and the respective amplifier groups as shown in FIG. 11A.

Further, in a case where cell arrays $10_1A$ and $10_2A$ are provided for one amplifier group 14A and cell arrays $10_1B$ and $10_2B$ are provided for one amplifier group 14B, a bit line gate group $70_1A$ is provided between the cell array $10_1A$ and the amplifier group 14A and a bit line gate group $70_2A$ is provided between the cell array $10_2A$ and the amplifier group 14A as shown in FIG. 11B. Likewise, a bit line gate group $70_1B$ is provided between the cell array $10_1B$ and the amplifier group 14B and a bit line gate group $70_2B$ is provided between the cell array $10_2B$ and the amplifier group 14B.

The bit line gate groups 70A, 70B are respectively constructed by gates $72_1A$ to $72_nA$ and gates $72_1B$ to $72_nB$ which are connected to the respective bit lines. The gates $72_1A$ to $72_nA$ are supplied with a control signal BLGA for electrically isolating the amplifier group 14A from the bit lines and the gates $72_1B$ to $72_nB$ are supplied with a control signal BLGB for electrically isolating the amplifier group 14B from the bit lines.

FIG. 12 is a circuit diagram of the bit line gate shown in FIG. 11A.

As shown in FIG. 12, the gate group 70A includes the gates $72_1A$ to $72_nA$. The gate $72_1A$ is explained as an example. The gate $72_1A$ is constructed by NMOSs $74_1A$ and $74_2A$ connected to the paired bit lines $BL_1A$ and $BBL_1A$. The other gates have the same construction, for example, the gate $72_2A$ is constructed by NMOSs $74_3A$ and $74_4A$ connected to the paired bit lines $BL_2A$ and $BBL_2A$, and the gate $72_nA$ is constructed by NMOSs $74_{n-1}A$ and $74_nA$ connected to the paired bit lines $BL_nA$ and $BBL_nA$. The gates of the NMOSs $74_1A$ to $74_6A$ are connected together. The gates are supplied with a control signal BLGA for electrically isolating the amplifier group from the bit lines. The construction of the gate group 70B is substantially the same as that of the gate group 70A, corresponding elements and signal lines are denoted by the same reference numerals each having a suffix "B" instead of a suffix "A", and the explanation thereof is omitted.

FIG. 13 is a diagram showing a floor plan of a DRAM according to a fourth embodiment of this invention.

As shown in FIG. 13, the DRAM according to the fourth embodiment includes word line potential holding circuits 50A, 50B and bit line gate groups 70A, 70B. The operation of the DRAM shown in FIG. 13 is explained below. Since the amplifier groups 14A, 14B in the device shown in FIG. 13 are each formed of an assembly of sense amplifiers, they are referred to as sense amplifier groups instead of the name of amplifier groups in the following explanation of the operation.

The DRAM shown in FIG. 13 is constructed such that hit and miss signals output from the comparators 100A and 100B can be supplied via different wirings. Thus, the hit and miss signals can be separately output from the comparator 100A via different wirings, or the hit and miss signals can be output via the same wiring as in the DRAM shown in FIG. 1. When the hit and miss signals are output via the same wiring, a plurality wiring lines, for example, four wiring lines are used, signals of "1, 0, 1, 0" are supplied via the respective wiring lines as a hit signal, signals of "0, 1, 0, 1" are supplied via the respective wiring lines as a "miss" signal, and thus the hit and miss signals can be determined according to the level difference of the signals.

FIGS. 14A to 14E are timing charts for illustrating the operation of the DRAM. In this case, assume that FIGS. 14A to 14E are continuous on the time base.

Figure 14A:
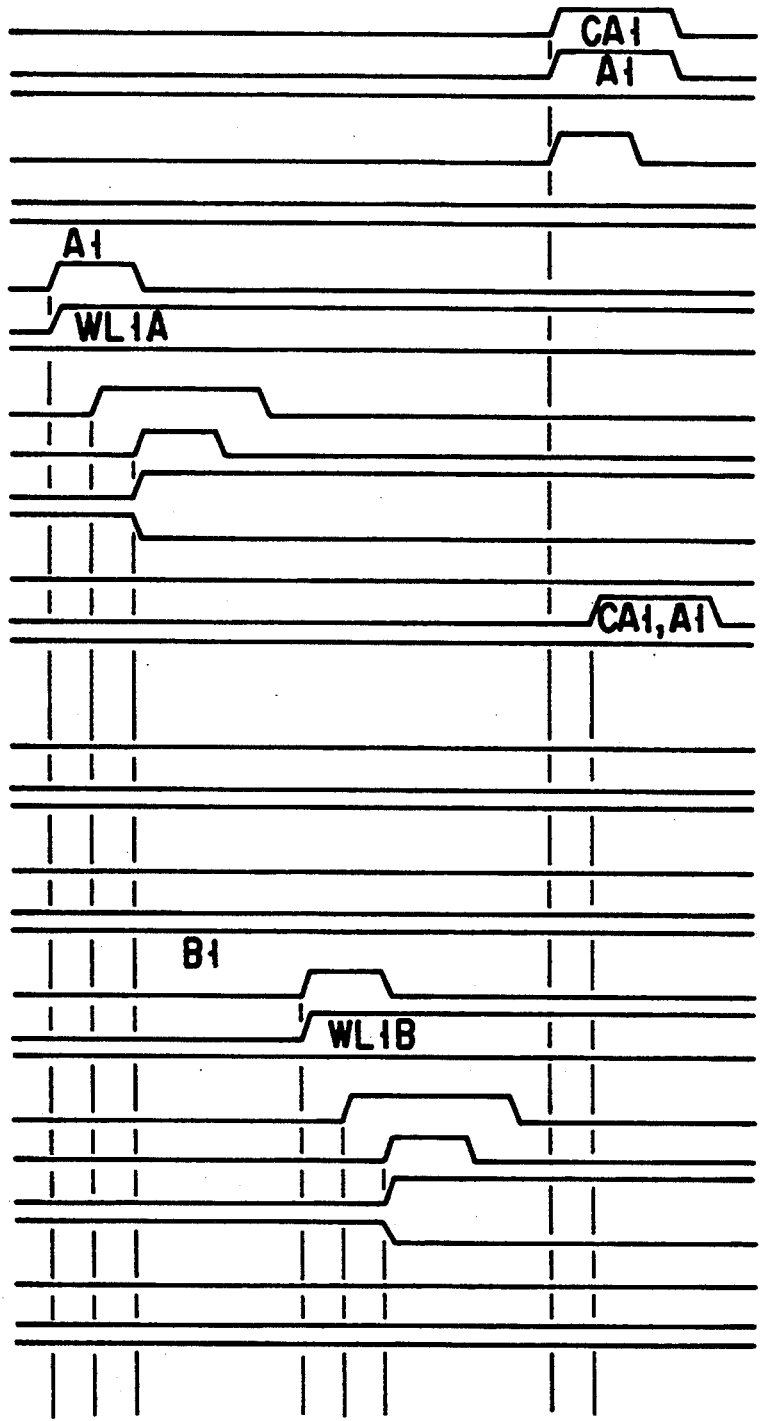

A period from time t1 to time t6 shown in FIG. 14A indicates a period of initial state setting operation. First, at the time t1, the word line latch signal WLTCA is raised according to a row address A1 stored in the register 80A when the power source switch is turned on and the potential of the word line $WL_1$ is raised in response to a rise of the word line latch signal. At the time t2, the signal BLKSELA for selecting a sense amplifier group is raised and the potentials of the power source lines SAP1A and SAN1A of the sense amplifier group are set to preset power source potentials in response to the rise of the signal BLKSELA at the time t3. Thus, in the sub-array A, a word line $WL_1A$ corresponding to the row address A1 is activated and data items of cells of a row connected to the word line $WL_1A$ are held in the sense amplifier group 14A and set into the output standby state. In the sub-array B, the same operations as those effected at the times t1 to t3 are effected at the times t4 to t6, and a word line $WL_1B$ corresponding to the row address B1 is activated according to the row address B1 stored in the register 80B. As a result, cell data items of a row connected to the word line $WL_1B$ are held in the sense amplifier group 14B and set into the output standby state.

A period from time t7 to time t8 shown in FIG. 14A indicates a data readout period. Assume that an access request containing the column address CA1 and row address A1 is made with respect to the sub-array A at the time t7. The comparator 100A compares the row address A1 with the row address stored in the register 80A and outputs a hit signal after recognizing that the compared row addresses coincide with each other. A column decoder 18A selects a column corresponding to the column address CA1 contained in the access request according to the column address CA1. Thus, data items DoutCA1, A1 are output at the time t8.

A period from time t9 to time t19 shown in FIG. 14B indicates a word line re-latching period. Assume that a request containing a row address B2 is made with respect to the sub-array B at the time t9. This case corresponds to a "miss" case, and therefore, the word line is re-latched. The re-latching operation is explained below. The comparator 100B compares the row address B2 with the row address stored in the register 80B. Since the row address B1 is stored in the register 80B, the compared row address are not coincident with each other. The comparator 100B recognizes the non-coincidence between the compared row addresses and outputs a miss signal. The register 80B is precharged in response to the miss signal. At the time t10, a word line precharge inverted signal BPRCHB falls and a signal WLTCB is raised to lower the potential of the word line $WL_1B$ at the time t11 while the inverted signal BPRCHB is kept at the low level. Then, the row address B2 is set into the register 80B at the time t12 while the potential of the word line $WL_1B$ is kept at the low level. As a result, the row address B2 is set into the register 80B instead of the row address B1. After this, at the time t13, the inverted signal BPRCHB is raised. Then, the reset signal RSTB is raised at the time t14 to reset the potentials of the power source lines SAP1B and SAN1B to the precharge potential. Next, the reset signal RSTB is raised at the time t15. Then, the signal WLTCB is raised at the time t16 to raise the potential of the word line $WL_2B$ corresponding to the row address B2 stored in the register 80B. After this, the signal BLKSELB is raised at the time t17 and a timing signal RBACPB is raised at the time t18 so as to set the power source lines SAP1B and SAN1B to preset power source potentials. Thus, the word line is re-latched according to the new row address B2.

Figure 14C:
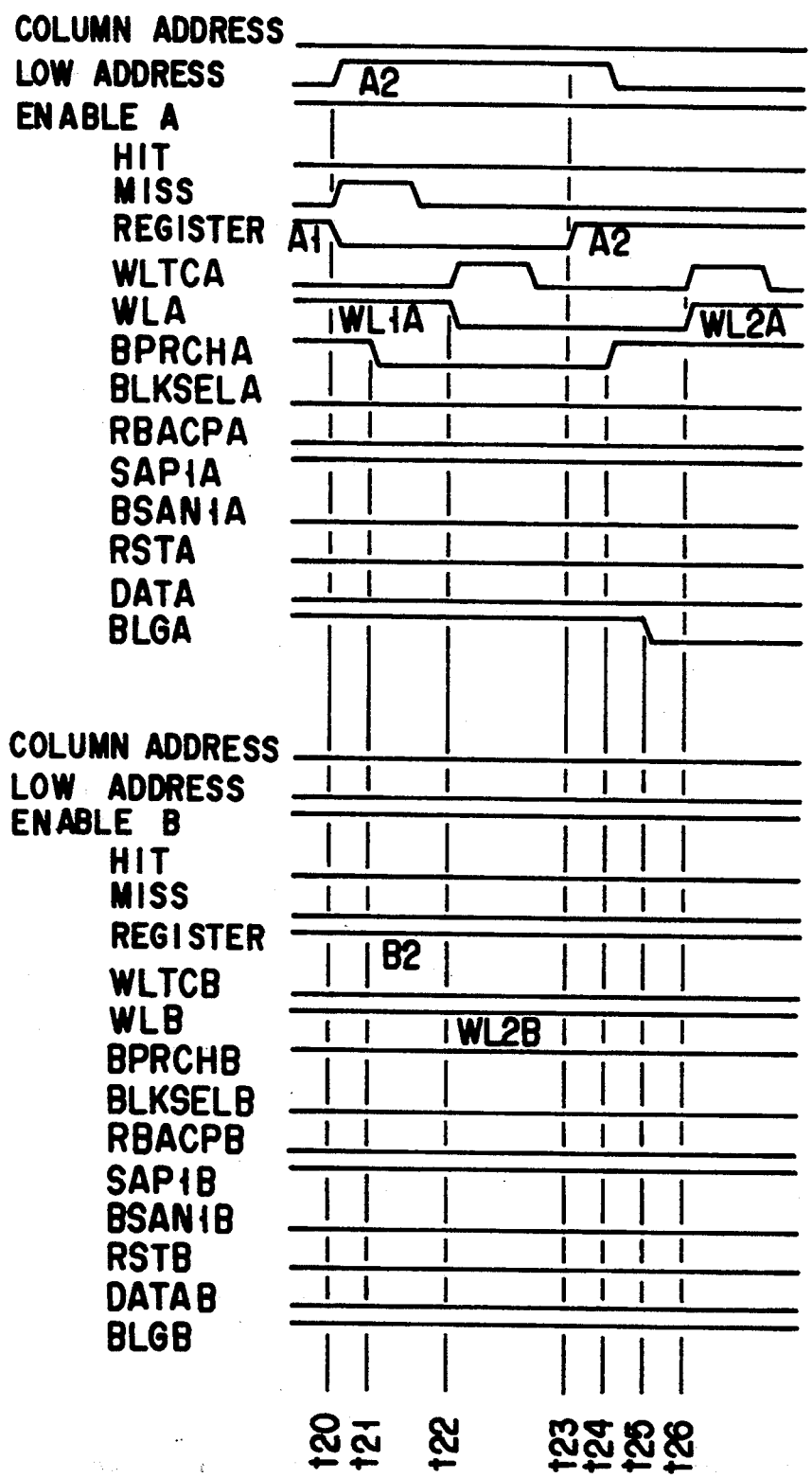

A period from time t20 to time t25 shown in FIG. 14C indicates a word line re-latching period by another method. Assume that a request containing a row address A2 is made with respect to the sub-array A at the time t20. This case corresponds to a "miss" case, and therefore, the word line is re-latched. First, the comparator 100A compares the row address A2 with the row address stored in the register 80A. Since the row address A1 is stored in the register 80A, the compared row addresses are not coincident with each other. The comparator 100A recognizes the non-coincidence between the compared row addresses and outputs a miss signal. The register 80A is precharged in response to the miss signal. At the time t21, a word line precharge inverted signal BPRCHA falls and a signal WLTCA is raised to lower the potential of the word line $WL_1A$ at the time t22 while the inverted signal BPRCHA is kept at the low level. Then, the row address A2 is set into the register 80A at the time t23 while the potential of the word line $WL_1A$ is kept at the low level. As a result, the row address A2 is set into the register 80A instead of the row address A1. After this, at the time t24, the inverted signal BPRCHA is raised. Then, the bit line gate control signal BLGA is lowered at the time t25 to electrically isolate the sense amplifier group from the bit lines while the potential of the word line $WL_1A$ is kept at the low level. Next, the signal WLTCA is raised at the time t26 with the sense amplifier group and the bit lines kept electrically isolated from each other so as to raise the potential of a word line $WL_2A$ corresponding to the row address A2 stored in the register 80A. In this condition, data held by the latched word line and row data held by the sense amplifier group are different from each other. Thus, data belonging to the latched word line and data held by the sense amplifier group can be set to different row data by using a bit line gate 70A. With this construction, even if the sense amplifier group 14A is set in the data output operation, for example, and cannot be set to the precharged state, next data can be read out to the bit line before the sense amplifier group 14A is precharged, thus making it possible to attain rapid data access. Further, in the case of "miss", it is possible to set only the word line to a new row while the row data in the preceding cycle causing "miss" is kept in the sense amplifier group instead of instantly changing the to-be-held data, and thus, various data readout methods can be obtained.

Figure 14D:
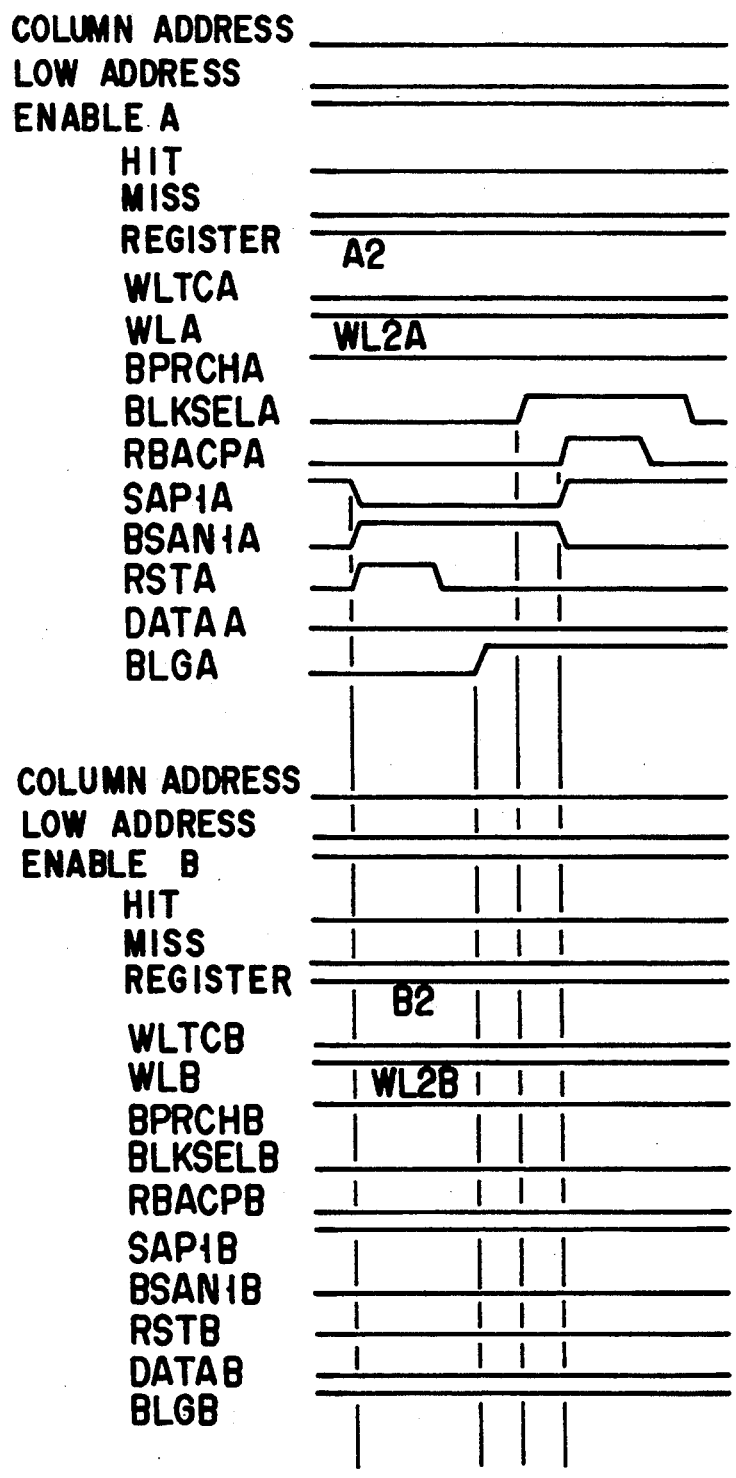

A period from time t27 to time t30 shown in FIG. 14D indicates a sense amplifier group re-latch period. At the time t27 at which the bit line gate control signal BLGA is lowered to electrically isolate the sense amplifier group 14A from the bit lines, a reset signal RSTA is raised and the potentials of the power source lines SAP1A and SAN1A are reset to the precharge potential. Then, at the time t28, the bit line gate control signal BLGA is raised to electrically connect the sense amplifier group 14A to the bit lines while the potentials of the power source lines SAP1A and SAN1A are kept reset at the precharge potential. Next, a signal BLKSELA is raised at the time t29 while the sense amplifier group 14A is kept connected to the bit lines, and the potentials of the power source lines SAP1A and SAN1A are set to respective preset power source potentials in response to the rise of the signal BLKSELA at the time t30. Thus, the bit line gate is enabled to electrically connect the sense amplifier group 14A to the bit lines so as to permit data of cells connected to the word line WL$_2$A to be latched into the sense amplifier group 14A.

Figure 14E:
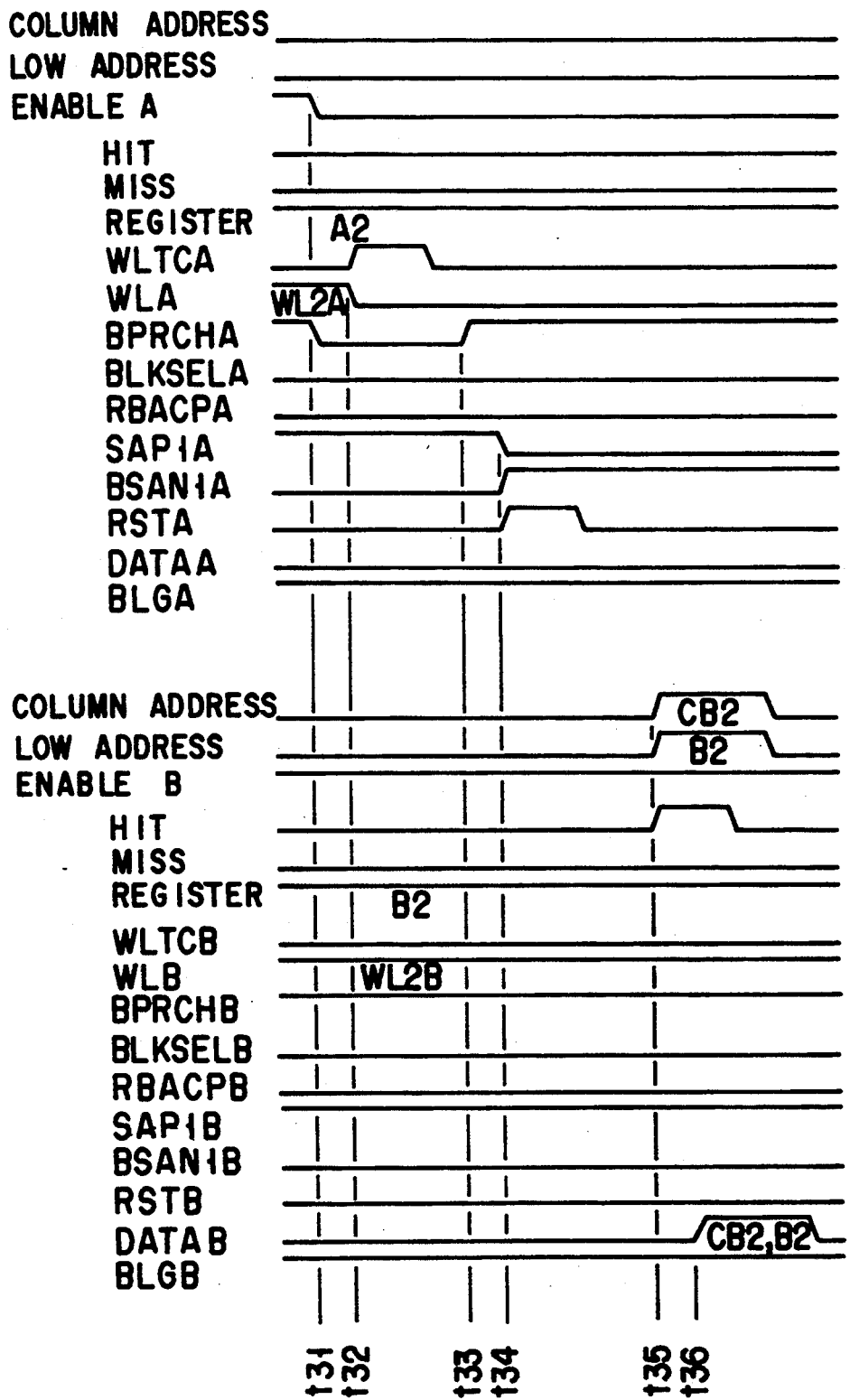

A period from time t31 to time t36 shown in FIG. 14E indicates a data readout period according to another method. At the time t31, a word line precharge inverted signal BPRCHA is lowered in the sub-array A, and at the same time, a permission signal (ENABLE A) is lowered to inhibit the operation of supplying a row address to be set into the register 80A to a word line. Then, a signal WLTCA is raised and the potential of the word line WL$_2$A is lowered at the time t32 while the inverted signal BPRCHA and ENABLE A are kept at the lowered level. After this, the inverted signal BPRCHA is raised at the time t33 while the potential of the word line WL$_2$A is kept at the lowered level. Next, the inverted signal BPRCHA is raised at the time t33 while the potential of the word line WL$_2$A is kept at the lowered level. Then, the reset signal RSTA is raised at the time t34 to reset the potentials of the power source lines SAP1A and SAN1A to the precharge potential while the inverted signal BPRCHA is kept at the raised level. Assume now that an access request containing a column address CB2 and row address B2 is made with respect to the sub-array B at the time t35 while the sense amplifier group of the sub-array A is thus set in the reset state. This case corresponds to a "hit" case of the row address, and at this time, a hit signal is raised, one column is selected according to the column address CB2 without effecting the word line selecting operation, and data items D$_{out}$CB2, B2 are output at the time t36. Thus, data readout can be effected in the sub-array B even when the sense amplifier group 14A of the sub-array A is set in the precharged state. Different operations can be simultaneously effected in a parallel fashion in the sub-arrays A and B and the operation speed can be enhanced by the parallel process.

Figure 15A:
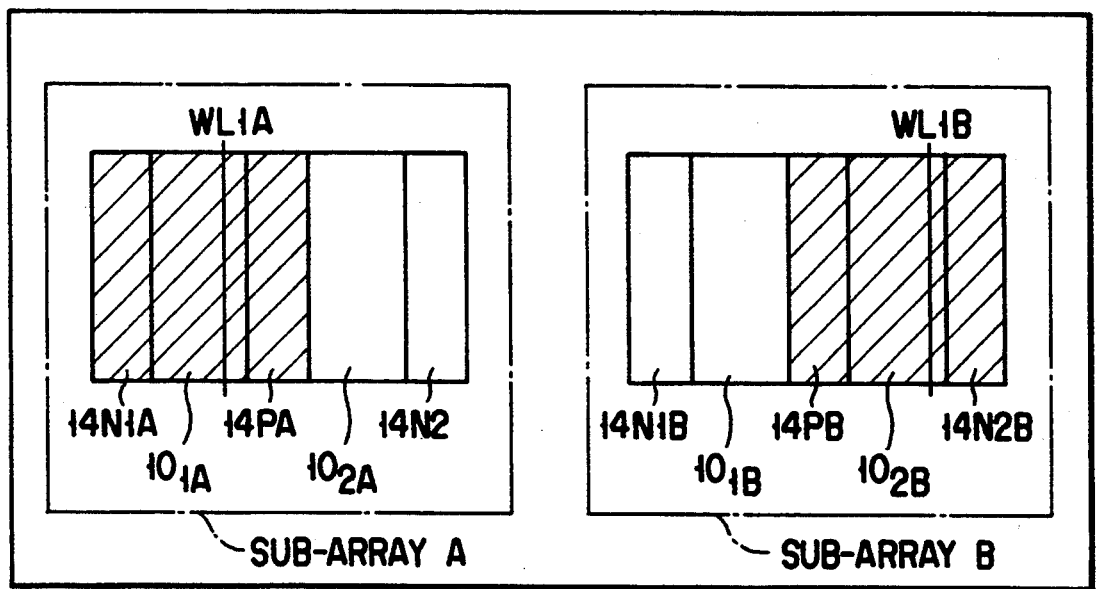
FIGS. 15A and 15B are diagrams showing a floor plan of a DRAM according to a second modification of this invention at different timings.
Figure 15B:
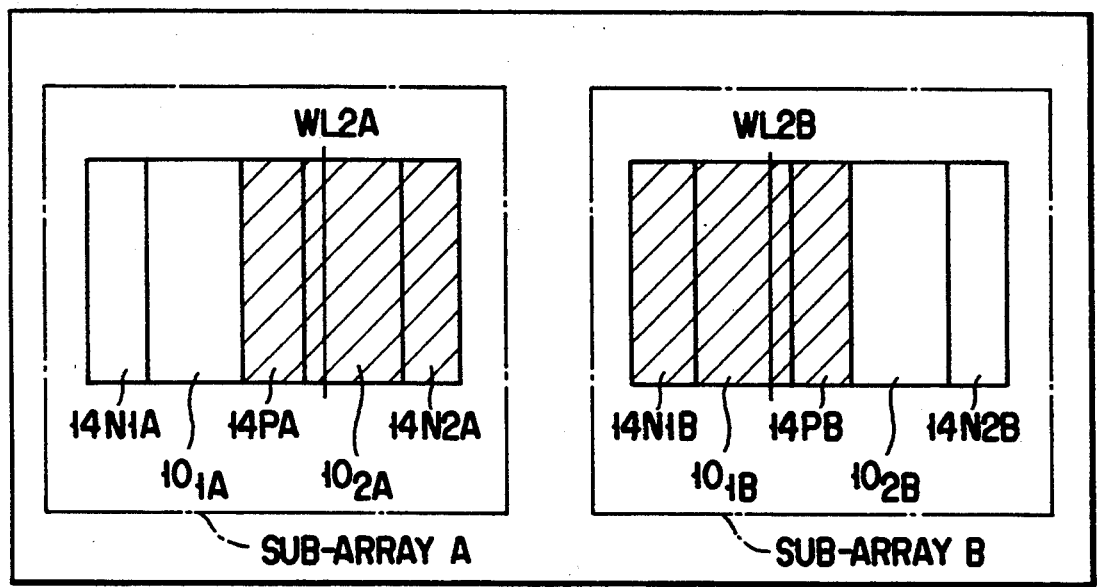

FIGS. 15A and 15B are diagrams showing a floor plan of a DRAM according to a second modification of this invention. FIGS. 15A and 15B show states at different timings.

In a case wherein the explanation is made only with respect to the sub-array A, sense amplifier groups 14$_{N1}$A, 14$_{N2}$A and 14pA commonly used by two memory cell arrays 10$_1$A and 10$_2$A are provided as shown in FIGS. 15A and 15B. The sense amplifier group 14pA is commonly used by the two memory cell arrays 10$_1$A and 10$_2$A. As shown in FIG. 15A, when a word line WL$_1$A connected to the cell array 10$_1$A is selected, the pair of sense amplifier groups 14pA and 14$_{N1}$A are activated and data items of cells connected to the word line WL$_1$A are held by the pair of sense amplifier groups 14pA and 14$_{N1}$A and set in the output standby state. On the other hand, when a word line WL$_2$A connected to the cell array 10$_2$A is selected as shown in FIG. 15B, the pair of sense amplifier groups 14pA and 14$_{N2}$A are activated and data items of cells connected to the word line WL$_2$A are held by the pair of sense amplifier groups 14pA and 14$_{N2}$A and set in the output standby state.

This invention can be applied to a DRAM in which members constituting the sense amplifier groups are changed according to a cell array to which a selected word line belongs.

FIGS. 16A and 16B are diagrams showing a floor plan of a DRAM according to a third modification of this invention. FIGS. 16A and 16B show states at different timings.

As shown in FIG. 16A, data items of rows corresponding to word lines WL$_1$A, WL$_1$B, WL$_1$C, WL$_1$D and WL$_1$E are held by sense amplifier groups 14A to 14E. Sense amplifier groups 14F to 14H are set in the precharged state.

The operation of changing the sense amplifier groups from the states shown in FIG. 16A to the states shown in FIG. 16B can be effected in a parallel fashion by causing a plurality of sub-arrays to simultaneously effect different operations. Alternatively, the above operation can be effected in a serial fashion by causing a plurality of sub-arrays to sequentially effect different operations.

In the state shown in FIG. 16B, part or all of the data held in the sense amplifier group 14A is output. In the sense amplifier groups 14B and 14D, data items of rows corresponding to the word lines WL$_1$B and WL$_1$D are discarded, and instead, data items of rows corresponding to the word lines WL$_2$B and WL$_2$D are held. Further, in the sense amplifier group 14C, data of a row corresponding to the word line WL$_1$C is kept held irrespective of the operations of the other sense amplifier groups. In the sense amplifier group 14E, data of a row corresponding to the word line WL$_1$E is discarded and the sense amplifier group 14E is set into the precharged state. Further, in the sense amplifier groups 14F and 14H, data items of rows corresponding to the word lines WL$_1$F and WL$_1$H are newly held. The sense amplifier group 14G is kept in the precharged state irrespective of the operations of the other sense amplifier groups. Thus, even if three or more sub-arrays are provided, each sub-array can maintain its own operation irrespective of the operation state of the other sub-arrays.

Figure 17:
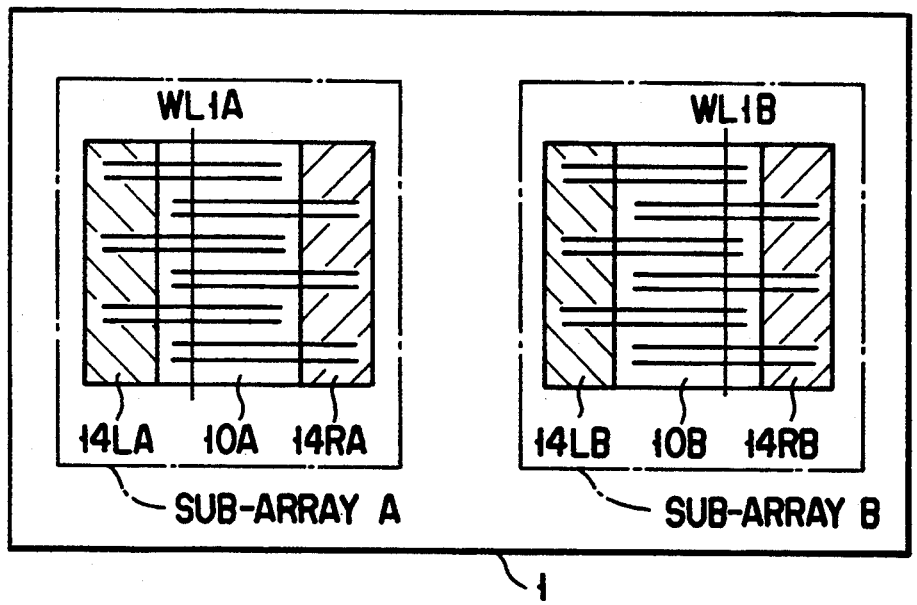
FIG. 17 is a diagram showing a floor plan of a DRAM according to a fourth modification of this invention.

FIG. 17 is a diagram showing a floor plan of a DRAM according to a fourth modification of this invention.

In a case where the explanation is made only with respect to the sub-array A, two sense amplifier groups 14$_L$A and 14$_R$A are provided for one memory cell array 10A as shown in FIG. 17. Bit lines are connected one of the sense amplifier groups 14$_L$A and 14$_R$A. The sense amplifier groups 14$_L$A and 14$_R$A hold data items of rows associated with a word line WL$_1$A.

Figure 18:
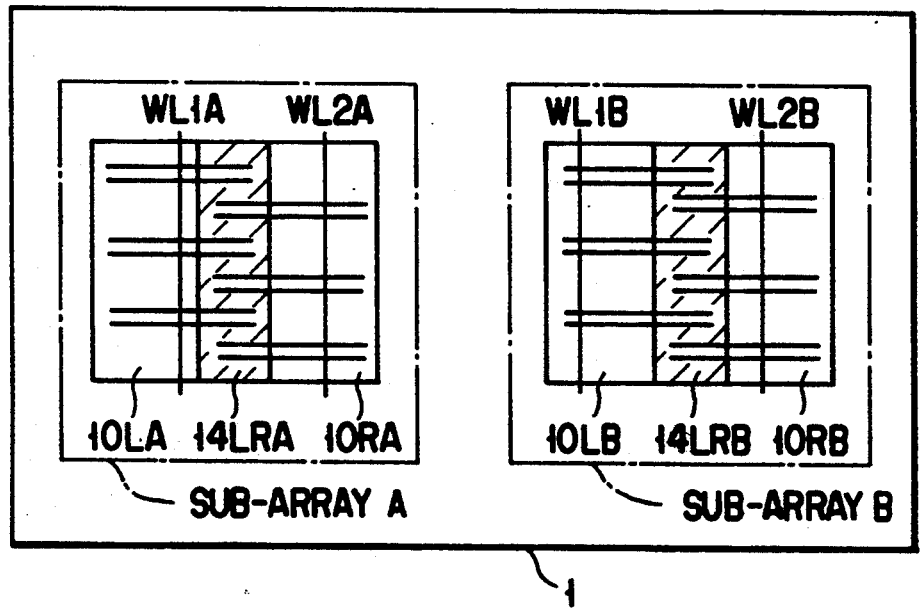
FIG. 18 is a diagram showing a floor plan of a DRAM according to a fifth modification of this invention.

FIG. 18 is a diagram showing a floor plan of a DRAM according to a fifth modification of this invention.

In a case where the explanation is made only with respect to the sub-array A, one sense amplifier group 14$_{LR}$A is provided for two memory cell arrays 10$_L$A and 10$_R$A as shown in FIG. 18. Since bit lines connected to the sense amplifier group 14$_{LR}$A are associated with the two memory cell arrays, the single sense amplifier group 14$_{LR}$A is commonly used by the two cell arrays 10$_L$A and 10$_R$A. With this type of device, data items of two rows which correspond to a word line WL$_1$A belonging to the cell array 10$_L$A and a word line WL$_2$A belonging to the cell array 10$_R$A can be simultaneously held in the sense amplifier group 14$_{LR}$A.

Figure 19:
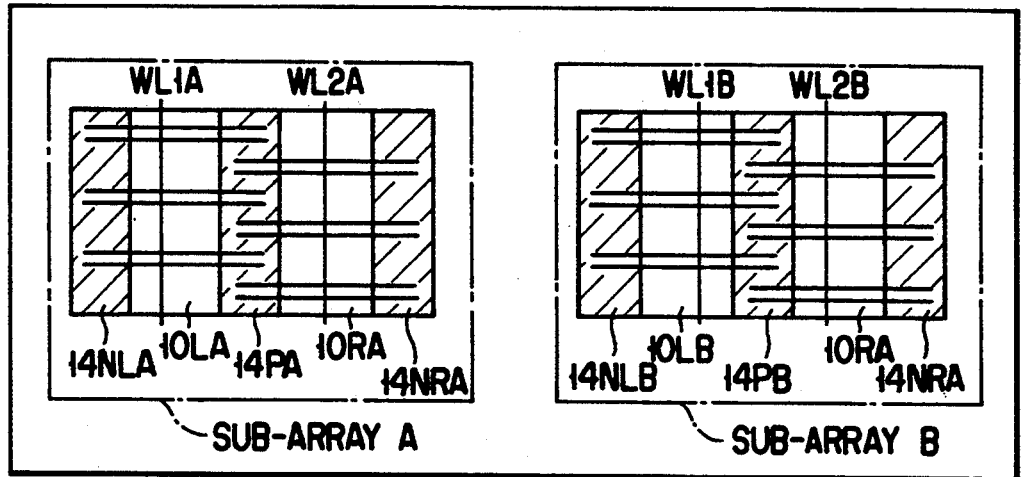
FIG. 19 is a diagram showing a floor plan of a DRAM according to a sixth modification of this invention.

FIG. 19 is a diagram showing a floor plan of a DRAM according to a sixth modification of this invention.

In a case where the explanation is made only with respect to the sub-array A, two memory cell arrays 10$_L$A and 10$_R$A are provided as shown in FIG. 18, the memory cell array 10$_L$A is connected to a pair of sense amplifier groups 14pA and 14$_{NL}$A and the memory cell array 10$_R$A is connected to a pair of sense amplifier groups $14_pA$ and $14_{NR}A$. With this type of device, data items of two rows which correspond to a word line $WL_1A$ belonging to the cell array $10_LA$ and a word line $WL_2A$ belonging to the cell array $10_RA$ can be simultaneously held in the pair of sense amplifier groups $14_pA$ and $14_{NL}A$ and the pair of sense amplifier groups $14_pA$ and $14_{NR}A$.

Figure 20:
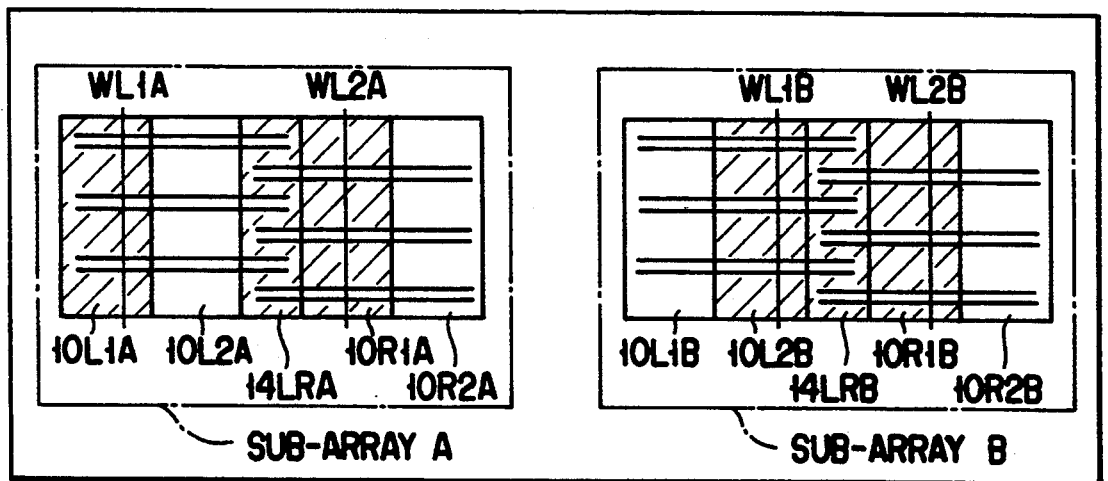
FIG. 20 is a diagram showing a floor plan of a DRAM according to a seventh modification of this invention.

FIG. 20 is a diagram showing a floor plan of a DRAM according to a seventh modification of this invention.

In a case where the explanation is made only with respect to the sub-array A, four memory cell arrays $10_{L1}A$, $10_{L2}A$, $10_{R1}A$ and $10_{R2}A$ are provided for one sense amplifier group $14_{LR}A$ as shown in FIG. 20. The cell arrays $10_{L1}A$, $10_{R1}A$ to which word lines $WL_1A$ and $WL_2A$ belong are activated and the other cell arrays $10_{L2}A$, $10_{R2}A$ are set in the precharged state. With this type of device, data items of two rows which correspond to a word line belonging to one of the cell arrays $10_{L1}A$ and $10_{L2}A$ and a word line belonging to one of the cell arrays $10_{R1}A$ and $10_{R2}A$ can be simultaneously held in the sense amplifier group $14_{LR}A$.

FIGS. 21A to 21D are diagrams showing a floor plan of a DRAM according to an eighth modification of this invention. The eighth modification is associated with the operation of holding data in sense amplifier groups using bit line gates. FIGS. 21A to 21D show the states of the device at different timings.

As shown in FIGS. 21A to 21D, one sense amplifier group $14_{LR}$ is provided for two memory cell arrays $10_L$ and $10_R$. The cell array $10_L$ and the sense amplifier group $14_{LR}$ are connected together via a bit line gate group $70_1$, and the cell array $10_R$ and the sense amplifier group $14_{LR}$ are connected together via a bit line gate group $70_2$.

Figure 21A:
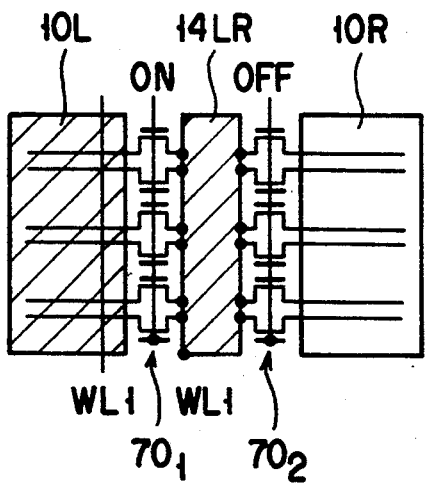
FIGS. 21A to 21D are diagrams showing a floor plan of a DRAM according to an eighth modification of this invention at different timings.
Figure 21C:
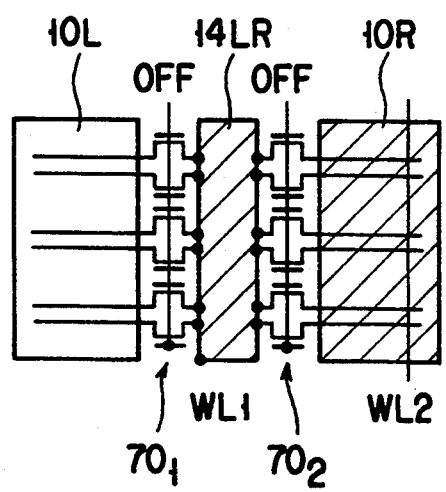
Figure 21B:
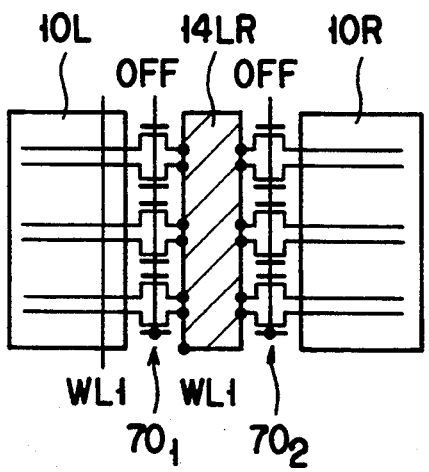
Figure 21D:
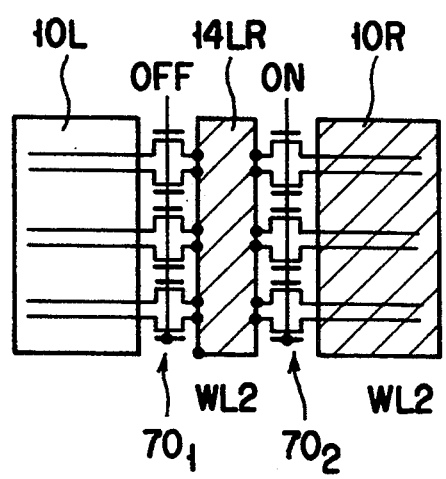

In the state shown in FIG. 21A, a row corresponding to the word line $WL_1$ is selected, the cell array $10_L$ is activated, and data of a cell connected to the word line $WL_1$ is held in the sense amplifier group $14_{LR}$. At this time, only the gate group $70_1$ among the bit line gate groups is set in the ON state. Then, as shown in FIG. 21B, the gate group $70_1$ is also set into the OFF state. At this time, the sense amplifier group $14_{LR}$ continues to hold data of the cell connected to the word line $WL_1$. Next, as shown in FIG. 21C, a row corresponding to the word line $WL_2$ is selected with the gate groups $70_1$ and $70_2$ kept in the OFF state, and the cell array $10_R$ is activated. At this time, the sense amplifier group $14_{LR}$ continues to hold data of the cell connected to the word line $WL_1$. Then, as shown in FIG. 21D, the bit line gate group $70_2$ is set into the ON state so as to cause the sense amplifier group $14_{LR}$ to hold data of a cell connected to the word line $WL_2$. According to the above operation, next data is supplied up to the bit lines before the sense amplifier group $14_{LR}$ is precharged, thereby making it possible to attain rapid data access.

Figure 22:
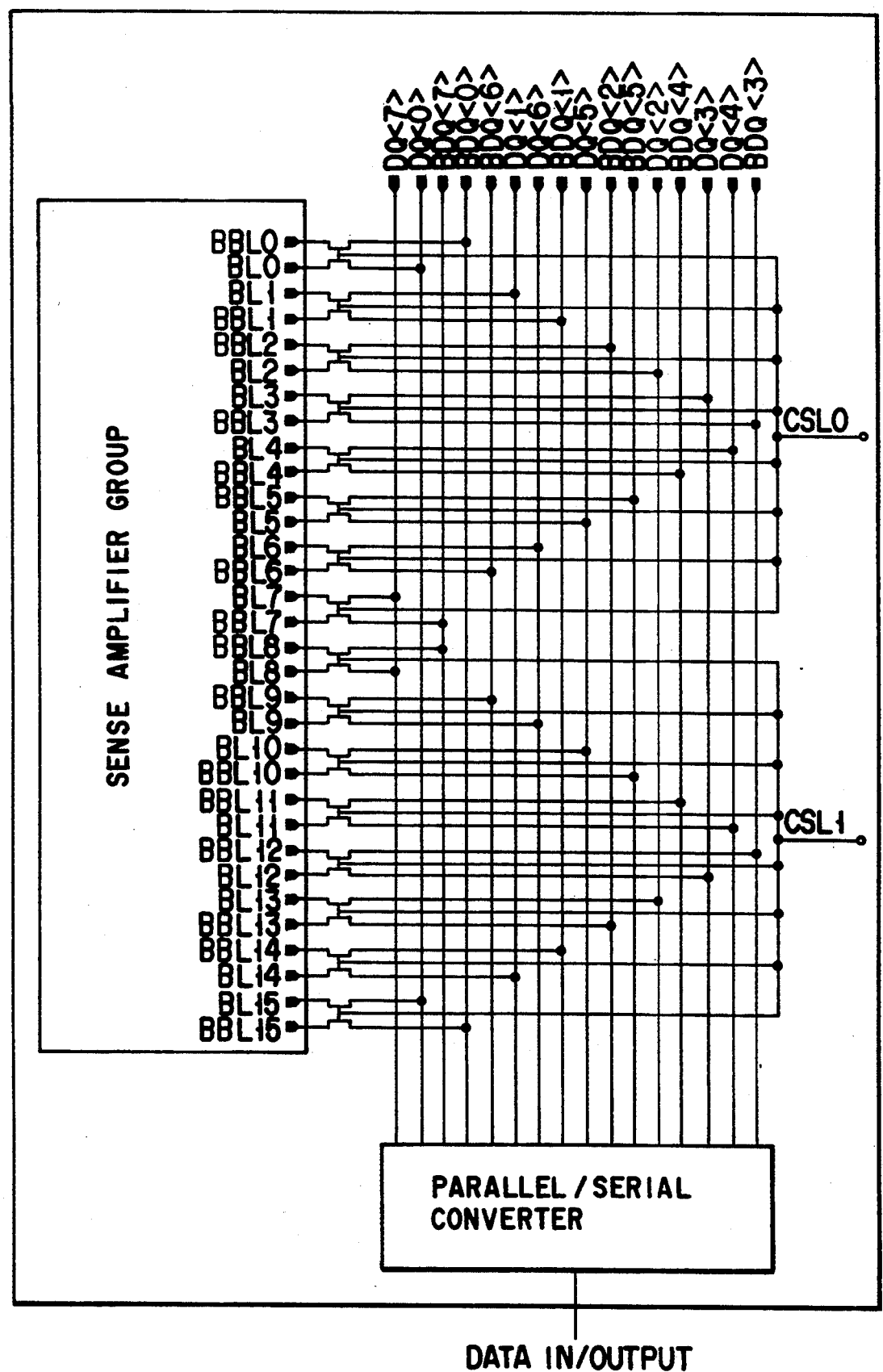
FIG. 22 is a block diagram showing a data output circuit section.

FIG. 22 is a block diagram showing a data output circuit section.

As shown in FIG. 22, a sense amplifier group 14 is divided into two sections each including eight sense amplifiers, for example, and one of the two sections is electrically connected to data lines. That is, data items held in the eight sense amplifiers are output to the data lines in a parallel fashion. The output data is subjected to the parallel/serial conversion in a converter 90 and output to the exterior at a high speed. As a result, a large band Weiss (transmission data amount for unit time) can be attained.

As described above, according to the semiconductor memories explained in the above embodiments, the data access time in a memory can be significantly reduced by selecting a row and holding data of the selected row in a sense amplifier to set the data access standby state. Further, more rapid data access can be attained by dividing a memory area into a plurality of sub-arrays and causing data of rows corresponding to different addresses to be stored into the sense amplifiers of the respective sub-arrays at different timings. As a result, the access speed of a memory can be set equivalent to the data processing speed of a CPU or the like and the operation speed of the computer can be significantly enhanced.

Figure 23:
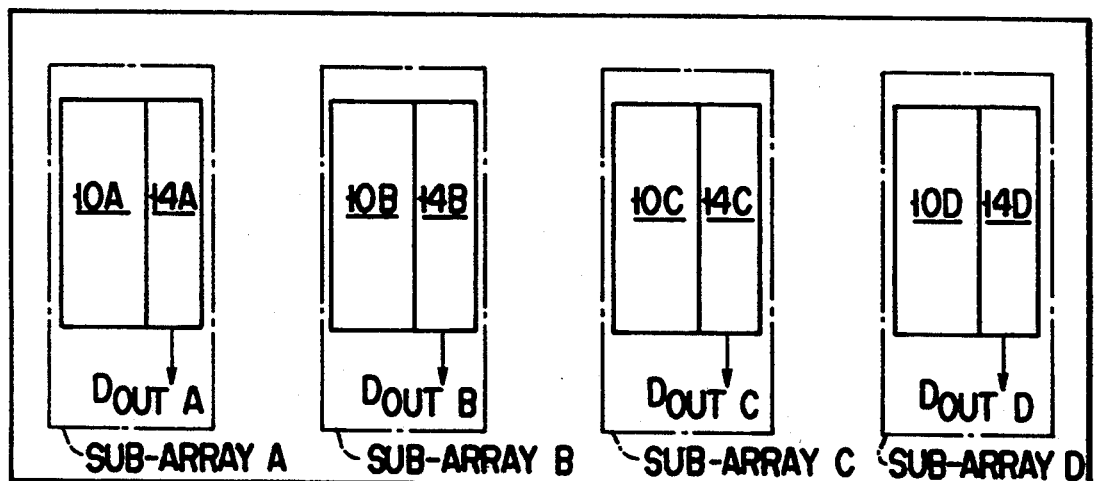
FIG. 23 is a diagram for illustrating a data fetch system.

FIG. 23 is a diagram for illustrating a data fetch system.

As shown in FIG. 23, a plurality of sense amplifier groups 14A to 14D can be constructed as a memory having a plurality of I/O units, for example, four I/O units by fetching data items $D_{out}A$ to $D_{out}D$ for each bit from the sub-arrays A to D in a parallel fashion.

With the above system, in the memory having a plurality of I/O units, the output portion of the memory area can be set near the I/O unit in the pattern area so that the delay time of a data signal in the chip can be reduced. Therefore, the data access time of the memory explained in the above embodiment can be reduced and the delay time of a data signal in the chip can be reduced so that the operation speed of the memory can be further enhanced.

As described above, according to this invention, a semiconductor device whose hit rate can be enhanced and whose data access time can be reduced can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor chip;
   a memory area including first and second sub-arrays which are provided in said chip, said first sub-array and said second sub-array being independently operated;
   memory cells arranged in a matrix form in said first sub-array;
   memory cells arranged in a matrix form in said second sub-array;
   a plurality of word lines provided for respective rows of said first sub-array and connected to said memory cells in said first sub-array;
   a plurality of bit lines provided for respective columns of said first sub-array and connected to said memory cells in said first sub-array;
   a plurality of word lines provided for respective rows of said second sub-array and connected to said memory cells in said second sub-array;
   a plurality of bit lines provided for respective columns of said second sub-array and connected to said memory cells in said second sub-array;
   first amplifying means provided in said chip, for amplifying data read out from said memory cells in said first sub-array;

amplifiers provided in said first amplifying means and connected to said plurality of bit lines of said first sub-array, said amplifiers holding data read out from said memory cells in said first sub-array;

second amplifying means provided in said chip, for amplifying data read out from said memory cells in said second sub-array:

amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array;

first word line potential holding means provided in said chip and connected to said word lines of said first sub-array, for holding the potential of said word lines of said first sub-array, said first word line potential holding means including first latch circuitry, a potential of one of said word lines of said first sub-array being determined according to a data holding state of said first latch circuitry; and second word line potential holding means provided in said chip and connected to said word lines of said second sub-array, for holding the potential of said word lines of said second sub-array, said second word line potential holding means including second latch circuitry, a potential of one of said word lines of said second sub-array being determined according to a data holding state of said second latch circuitry, wherein a potential held by one of said first word line potential holding means and said second word line potential holding means is precharged in a state in which said first word line potential holding means and said second word line potential holding means hold respective potentials, and the precharged word line potential holding means holds a potential of a new word line corresponding to a new row address supplied to one of said sub-arrays to which said precharged word line potential holding circuit corresponds according to the new row address and the other of said first and second word line potential holding means continues to hold the potential while this operation is effected.

2. A semiconductor memory device comprising:

a semiconductor chip;

a memory area including first and second sub-arrays which are provided in said chip, said first sub-array and said second sub-array being independently operated;

memory cells arranged in a matrix form in said first sub-array;

memory cells arranged in a matrix form in said second sub-array;

a plurality of word lines provided for respective rows of said first sub-array and connected to said memory cells in said first sub-array;

a plurality of bit lines provided for respective columns of said first sub-array and connected to said memory cells in said first sub-array;

a plurality of word lines provided for respective rows of said second sub-array and connected to said memory cells in said second sub-array;

a plurality of bit lines provided for respective columns of said second sub-array and connected to said memory cells in said second sub-array;

first amplifying means provided in said chip, for amplifying data read out from said memory cells in said first sub-array;

amplifiers provided in said first amplifying means and connected to said plurality of bit lines of said first sub-array, said amplifiers holding data read out from said memory cells in said first sub-array;

second amplifying means provided in said chip, for amplifying data read out from said memory cells in said second sub-array;

amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array;

first gate means provided in said chip, for selectively electrically connecting said amplifiers of said first amplifying means and said bit lines of said first sub-array;

gates provided in said first gate means and connected to a plurality of bit lines of said first sub-array;

second gate means provided in said chip, for selectively electrically connecting said amplifiers of said second amplifying means and said bit lines of said second sub-array;

gates provided in said second gate means and connected to a plurality of bit lines of said second sub-array;

first word line potential holding means provided in said chip and connected to said word lines of said first sub-array, for continuously holding the potentials of said word lines of said first sub-array; and second word line potential holding means provided in said chip and connected to said word lines of said second sub-array, for continuously holding the potentials of said word lines of said second sub-array, wherein said amplifiers of said first amplifying means are electrically isolated from said bit lines of said first sub-array by said gates of said first gate means after said amplifiers of said first amplifying means hold first data supplied from the memory cells connected to a first word line in a state in which at least said first word line potential holding means holds the potential of said first word line, said first word line potential holding means being set and kept in the nonactive state until the first data held in said amplifiers of said first amplifying means is replaced by second data.

3. A semiconductor memory device comprising:

a semiconductor chip;

a memory area including first and second sub-arrays which are provided in said chip, said first sub-array and said second sub-array being independently operated;

memory cells arranged in a matrix form in said first sub-array;

memory cells arranged in a matrix form in said second sub-array;

a plurality of word lines provided for respective rows of said first sub-array and connected to said memory cells in said first sub-array;

a plurality of bit lines provided for respective columns of said first sub-array and connected to said memory cells in said first sub-array;

a plurality of word lines provided for respective rows of said second sub-array and connected to said memory cells in said second sub-array;

a plurality of bit lines provided for respective columns of said second sub-array and connected to said memory cells in said second sub-array;

first amplifying means provided in said chip, for amplifying data read out from said memory cells in said first sub-army;

amplifiers provided in said first amplifying means and connected to said plurality of bit lines of said first sub-array, said amplifiers holding data read out from said memory cells in said first sub-array;

second amplifying means provided in said chip, for amplifying data read out from said memory cells in said second sub-array;

amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array;

first gate means provided in said chip, for selectively electrically connecting said amplifiers of said first amplifying means and said bit lines of said first sub-array;

gates provided in said first gate means and connected to a plurality of bit lines of said first sub-array;

second gate means provided in said chip, for selectively electrically connecting said amplifiers of said second amplifying means and said bit lines of said second sub-array;

gates provided in said second gate means and connected to a plurality of bit lines of said second sub-array;

first word line potential holding means provided in said chip and connected to said word lines of said first sub-array, for continuously holding the potentials of said word lines of said first sub-array; and second word line potential holding means provided in said chip and connected to said word lines of said second sub-array, for continuously holding the potentials of said word lines of said second sub-array, wherein said amplifiers of said first amplifying means are electrically isolated from the bit lines of said first sub-array by said gates of said first gate means in a state in which at least said first word line potential holding means holds the potential of a first word line and said amplifiers of said first amplifying means holds first data, the potential held by said first word lines potential holding means being precharged, the precharged word line potential holding means holding the potential of a second word line corresponding to a new row address supplied to said first sub-array according to the new row address, and at least said amplifiers of said first amplifying means continuously holding the first data while the above operation is effected.

4. A semiconductor memory device comprising:

a semiconductor chip;

a memory area including first and second sub-arrays which are provided in said chip, said first sub-array and said second sub-array being independently operated;

memory cells arranged in a matrix form in said first sub-array;

memory cells arranged in a matrix form in said second sub-array;.

a plurality of word lines provided for respective rows of said first sub-array and connected to said memory cells in said first sub-array;

a plurality of bit lines provided for respective columns of said first sub-array and connected to said memory cells in said first sub-array;

a plurality of word lines provided for respective rows of said second sub-array and connected to said memory cells in said second sub-array;

a plurality of bit lines provided for respective columns of said second sub-array and connected m said memory cells in said second sub-array;

first amplifying means provided in said chip, for amplifying data read out from said memory cells in said first sub-array:

amplifiers provided in said first amplifying means and connected to said plurality of bit lines of said first sub-array, said amplifiers holding data read out from said memory cells in said first sub-array;

second amplifying means provided in said chip, for amplifying data read out from said memory cells in said second sub-array;

amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array first gate means provided in said chip, for selectively electrically connecting said amplifiers of said first amplifying means and said bit lines of said first sub-array;

gates provided in said first gate means and connected to a plurality of bit lines of said first sub-array;

second gate means provided in said chip, for selectively electrically connecting said amplifiers of said second amplifying means and said bit lines of said second sub-array;

gates provided in said second gate means and connected to a plurality of bit lines of said second sub-array;

first word line potential holding means provided in said chip and connected to said word lines of said first sub-array, for continuously holding the potentials of said word lines of said first sub-array; and second word line potential holding means provided in said chip and connected to said word lines of said second sub-array, for continuously holding the potentials of said word lines of said second sub-array, wherein said amplifiers of said first amplifying means are electrically isolated from the bit lines of said first sub-array by said gates of said first gate means in a state in which at least said first word line potential holding means holds the potential of a first word line and said amplifiers of said first amplifying means holds first data, the potential held by said first word line potential holding means being precharged, the precharged word line potential holding means holding the potential of a second word line corresponding to a new row address supplied to said first sub-array according to the new row address, first data held by said amplifiers of said first amplifying means being precharged, and second data from memory cells connected to said second word line being held in said amplifiers of said first amplifying means by electrically connecting said amplifiers of said first amplifying means to the bit lines of said first sub-array via said gates of said first gate means.

5. A semiconductor memory device comprising:
a semiconductor chip;
a memory area including first and second sub-arrays which are provided in said chip, said first sub-array and said second sub-array being independently operated;
memory cells arranged in a matrix form in said first sub-array;
memory cells arranged in a matrix form in said second sub-array;
a plurality of word lines provided for respective rows of said first sub-array and connected to said memory cells in said first sub-array:
a plurality of bit lines provided for respective columns of said first sub-array and connected to said memory cells in said first sub-array:
a plurality of word lines provided for respective rows of said second sub-array and connected to said memory cells in said second sub-array:
a plurality of bit lines provided for respective columns of said second sub-array and connected to said memory cells in said second sub-array;
first amplifying means provided in said chip, for amplifying data read out from said memory cells in said first sub-array:
amplifiers provided in said first amplifying means and connected to said plurality of bit lines of said first sub-array, said amplifiers holding data read out from said memory cells in said first sub-array:
second amplifying means provided in said chip, for amplifying data read out from said memory cells in said second sub-array;
amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array;
a first row decoder connected to said word lines of said first sub-array, for decoding a row address supplied to said first sub-array:
a second row decoder connected to said word lines of said second sub-array, for decoding a row address supplied to said second sub-array:
first memory means connected to said first row decoder, for storing a row address supplied to said first sub-array;
second memory means connected to said second row decoder, for storing a row address supplied to said second sub-array:

a first comparator electrically connected to said first memory means and supplied with an input row address supplied to said first sub-array, said first comparator comparing the input row address with a row address stored in said first memory means; and
a second comparator electrically connected to said second memory means and supplied with an input row address supplied to said second sub-array, said second comparator comparing the input row address with a row address stored in said second memory means.

6. A semiconductor memory device according to claim 5, wherein said first comparator outputs a first coincidence signal when the input row address and the row address stored in said first memory means coincide with each other, and outputs a first non-coincidence signal when the input row address and the row address stored in said first memory means do not coincide with each other, said second comparator outputs a second coincidence signal when the input row address and the row address stored in said second memory means coincide with each other, and outputs a second non-coincidence signal when the input row address and the row address stored in said second memory means do not coincide with each other.

7. A semiconductor memory device according to claim 6, wherein when the first coincidence signal is outputted, a data set residing in a column is selected from among data held in said amplifiers of said first amplifying means and the selected data set is outputted, whereas when the first non-coincidence signal is outputted, a data set in a row and column is selected from among data stored in said memory cells of said first sub-array and the selected data set is outputted, and when the second coincidence signal is outputted, a data set residing in a column is selected from among data held in said amplifiers of said second amplifying means and the selected data set is outputted, whereas when the second non-coincidence signal is outputted, a data set residing in a row and a column is selected from among data stored in said memory cells of said second sub-array and the selected data set is outputted.

8. A semiconductor memory device comprising:
a semiconductor chip;
a memory area including first and second sub-arrays which are provided in said chip, said first sub-array and said second sub-array being independently operated;
memory cells arranged in a matrix form in said first sub-array;
memory cells arranged in a matfix form in said second sub-array:
a plurality of word lines provided for respective rows of said first sub-array and connected to said memory cells in said first sub-array;
a plurality of bit lines provided for respective columns of said first sub-array and connected to said memory cells in said first sub-array:
a plurality of word lines provided for respective rows of said second sub-array and connected to said memory cells in said second sub-array;
a plurality of bit lines provided for respective columns of said second sub-array and connected to said memory cells in said second sub-array;
first amplifying means provided in said chip, for amplifying data read out from said memory cells in said first sub-array;

amplifiers provided in said first amplifying means and connected to said plurality of bit lines of said first sub-array, said amplifiers holding data read out from said memory cells in said first sub-array;

second amplifying means provided in said chip, for amplifying dam read out from said memory cells in said second sub-array;

amplifiers provided in said second amplifying means and connected to said plurality of bit lines of said second sub-array, said amplifiers holding data read out from said memory cells in said second sub-array, wherein data which correspond to different row addresses of said first sub-array and said second sub-array are respectively held in said amplifiers of said first sub-array and said amplifiers of said second sub-array first gate means provided in said chip, for selectively electrically connecting said amplifiers of said first amplifying means and said bit lines of said first sub-array:

gates provided in said first gate means and connected to a plurality of bit lines of said first sub-array:

second gate means provided in said chip, for selectively electrically connecting said amplifiers of said second amplifying means and said bit lines of said second sub-array;

gates provided in said second gate means and connected to a plurality of bit lines of said second sub-array;

first word line potential holding means provided in said chip and connected to said word lines of said first sub-array, for continuously holding the potentials of said word lines of said first sub-array;

second word line potential holding means provided in said chip and connected to said word lines of said second sub-array, for continuously holding the potentials of said word lines of said second sub-array;

a first comparator electrically connected to said first word line potential holding means and supplied with an input row address supplied to said first sub-array, said first comparator comparing the input row address with a row address stored in said first word line potential holding means; and a second comparator electrically connected to said second word line potential holding means and supplied with an input row address supplied to said second sub-array, said second comparator comparing the input row address with a row address stored in said second word line potential holding means.

9. A semiconductor memory device according to claim 8, wherein said first comparator outputs a first coincidence signal when the input row address and the row address stored in said first word line potential holding means coincide with each other, and outputs a first non-coincidence signal when the input row address and the row address stored in said first word line potential holding means do not coincide with each other, said second comparator outputs a second coincidence signal when the input row address and the row address stored in said second word line potential holding means coincide with each other, and outputs a second non-coincidence signal when the input row address and the row address stored in said second word line potential holding means do not coincide with each other.

10. A semiconductor memory device according to claim 9, wherein when the first coincidence signal is outputted, a data set residing in a column is selected from among data held in said amplifiers of said first amplifying means and the selected data set is outputted, whereas when the first non-coincidence signal is outputted, a data set in a row and column is selected from among data stored in said memory cells of said first sub-array and the selected data set is outputted, and when the second coincidence signal is outputted, a data set residing in a column is selected from among data held in said amplifiers of said second amplifying means and the selected data set is outputted, whereas when the second non-coincidence signal is outputted, a data set residing in a row and a column is selected from among data stored in said memory cells of said second sub-array and the selected data set is outputted.

* * * * *